(12) United States Patent     (10) Patent No.: US 9,791,509 B2
Zhong et al.     (45) Date of Patent: Oct. 17, 2017

(54) MONITORING MICROPROCESSOR INTERFACE INFORMATION FOR A PRESET SERVICE USING AN ADDRESS BASED FILTER

(71) Applicant: Huawei Technologies Co., Ltd., Shenzhen (CN)

(72) Inventors: Shichun Zhong, Chengdu (CN); Yanbin Luo, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 211 days.

(21) Appl. No.: 14/699,892

(22) Filed: Apr. 29, 2015

(65) Prior Publication Data

US 2015/0323602 A1    Nov. 12, 2015

(30) Foreign Application Priority Data

May 6, 2014    (CN) .......................... 2014 1 0189442

(51) Int. Cl.
*G01R 31/3183*    (2006.01)
*G01R 31/3177*    (2006.01)
(Continued)

(52) U.S. Cl.
CPC . *G01R 31/318371* (2013.01); *G01R 31/3177* (2013.01); *G01R 31/31703* (2013.01);
(Continued)

(58) Field of Classification Search
CPC ........ G01R 31/31703; G01R 31/31712; G01R 31/31718; G01R 31/3177;
(Continued)

(56) References Cited

U.S. PATENT DOCUMENTS

2003/0051122 A1* 3/2003 Sato ........................ G06F 11/28
                                               712/227
2007/0294583 A1* 12/2007 Traskov .............. G06F 11/3648
                                               714/37

(Continued)

FOREIGN PATENT DOCUMENTS

CN     101227515 A    7/2008
CN     102937930 A    2/2013
(Continued)

*Primary Examiner* — Albert Decady
*Assistant Examiner* — Christian Dorman
(74) *Attorney, Agent, or Firm* — Leydig, Voit & Mayer, Ltd.

(57) ABSTRACT

Embodiments of the present invention, which relate to the field of electronic technologies, provide a monitoring method, a monitoring apparatus, and an electronic device, which can accurately locate an error point in MPI information delivered by a system chip. The apparatus may include: an address filter, a read/write controller connected to the address filter, and a memory connected to the read/write controller, where the address filter is configured to acquire multiple pieces of MPI information, and obtain, by filtering the multiple pieces of MPI information, first MPI information corresponding to a first service that is preset; the read/write controller is configured to write, into the memory according to a time sequence of receiving the first MPI information, the first MPI information that is obtained by the address filter by filtering; and the memory is configured to store the first MPI information written by the read/write controller.

17 Claims, 11 Drawing Sheets

(51) Int. Cl.
*G01R 31/317* (2006.01)
*G06F 11/07* (2006.01)
*G06F 11/30* (2006.01)
*G06F 11/34* (2006.01)

(52) U.S. Cl.
CPC . *G01R 31/31712* (2013.01); *G01R 31/31718* (2013.01); *G06F 11/0703* (2013.01); *G06F 11/3024* (2013.01); *G06F 11/3072* (2013.01); *G06F 11/348* (2013.01); *G06F 11/3089* (2013.01); *G06F 11/3471* (2013.01)

(58) Field of Classification Search
CPC ......... G01R 31/318371; G06F 11/0703; G06F 11/3024; G06F 11/3041; G06F 11/3072; G06F 11/3089; G06F 11/3466; G06F 11/3471; G06F 11/348; G06F 11/36; G06F 11/362; G06F 11/3636; G06F 11/3648; G06F 9/30098; G06F 9/30145; G06F 9/3877; G06F 13/12; G06F 13/124; G06F 13/126

See application file for complete search history.

(56) References Cited

U.S. PATENT DOCUMENTS

| | | | |
|---|---|---|---|
| 2008/0288741 A1* | 11/2008 | Lee | G06F 11/3471 711/200 |
| 2012/0066552 A1* | 3/2012 | Gilkerson | G06F 11/3471 714/45 |
| 2015/0323602 A1 | 11/2015 | Zhong et al. | |

FOREIGN PATENT DOCUMENTS

| CN | 103984614 A | 8/2014 |
|---|---|---|
| GB | 2483509 A | 3/2012 |
| JP | H1127219 A | 1/1999 |

* cited by examiner

MONITORING MICROPROCESSOR INTERFACE INFORMATION FOR A PRESET SERVICE USING AN ADDRESS BASED FILTER

CROSS-REFERENCE TO RELATED APPLICATIONS

This application claims priority to Chinese Patent Application No. 201410189442.5, filed on May 6, 2014, which is hereby incorporated by reference in its entirety.

TECHNICAL FIELD

The present invention relates to the field of electronic technologies, and in particular, to a monitoring method, a monitoring apparatus, and an electronic device.

BACKGROUND

At present, an integrated circuit has been widely applied to various electronic devices. As shown in FIG. 1, an electronic device may include a system chip and a service chip, and the system chip and the service chip may communicate by using an MPI (Micro Process Interface, microprocessor interface).

In the prior art, service software runs on the system chip of the electronic device. When the electronic device needs to implement a service, the system chip may deliver MPI information to the service chip, that is, the system chip may deliver, to the service chip by using the service software, configuration information of an address register corresponding to the service, so that the service chip can process the service according to the configured address register. Specifically, the system chip delivers the MPI information to a second MPI interface by using the service software, and sends the MPI information to a first MPI interface through the second MPI interface, so that the service chip may configure a corresponding address register according to the configuration information, and process the service according to the configured address register, where the second MPI interface is disposed on the system chip, and the first MPI interface is disposed on the service chip.

However, the service chip only passively receives the MPI information delivered by the system chip. When the MPI information sent by the system chip is incorrect, the service chip incorrectly configures the corresponding address register according to the MPI information, so that the service chip incorrectly processes the service according to the incorrectly configured address register. In this case, a software engineer need to repeatedly query, by using the service software, software code of the foregoing MPI information in tedious software code, to find an error point in the MPI information. Because there is a large amount of software code of the service software, efficiency of locating an error point in configuration of the service chip is relatively low.

SUMMARY

Embodiments of the present invention provide a monitoring method, a monitoring apparatus, and an electronic device, which can accurately locate an error point in MPI information delivered by a system chip, thereby improving efficiency of locating an error point in configuration of a service chip.

In order to achieve the foregoing objectives, the embodiments of the present invention adopt the following technical solutions:

According to a first aspect, an embodiment of the present invention provides a monitoring apparatus, including: an address filter, a read/write controller connected to the address filter, and a memory connected to the read/write controller, where the address filter is configured to acquire multiple pieces of microprocessor interface MPI information, and obtain, by filtering the multiple pieces of MPI information, first MPI information corresponding to a first service that is preset;

the read/write controller is configured to write, into the memory according to a time sequence of receiving the first MPI information, the first MPI information that is obtained by the address filter by filtering; and the memory is configured to store the first MPI information written by the read/write controller.

In a first possible implementation manner of the first aspect, each piece of MPI information includes one piece of MPI address information and one piece of MPI data information that is corresponding to the one piece of MPI address information, and the one piece of MPI address information includes $2^n$ bits, where $n \geq 1$; and the address filter includes $2^n$ bit filtering circuits and an n-level first logic gate circuit that includes $2^n-1$ first logic gates, where the $m^{th}$-level first logic gate circuit in the n-level first logic gate circuit includes $2^{n-m}$ first logic gates, the first logic gate is an OR gate or an AND gate, and $1 \leq m \leq n$, where the $2^n$ bit filtering circuits are configured to separately acquire values of $2^n$ bits of second MPI address information in second MPI information, perform filtering on the values of the $2^n$ bits, and output $2^n$ filtering results, where the second MPI information is any one of the multiple pieces of MPI information; and the n-level first logic gate circuit is configured to determine, according to the $2^n$ filtering results, whether the second MPI information is the first MPI information.

With reference to the first possible implementation manner of the first aspect, in a second possible implementation manner, the $k^{th}$ bit filtering circuit in the $2^n$ bit filtering circuits includes one second logic gate and one third logic gate, the second logic gate includes a first input pin of the second logic gate, a second input pin of the second logic gate, and an output pin of the second logic gate, and the third logic gate includes a first input pin of the third logic gate, a second input pin of the third logic gate, and an output pin of the third logic gate, where the output pin of the second logic gate is connected to the first input pin of the third logic gate, the second logic gate is an XOR gate or an XNOR gate, and the third logic gate is an AND gate or an OR gate; and when the first logic gate is an OR gate, the second logic gate is an XOR gate, and the third logic gate is an AND gate; or, when the first logic gate is an AND gate, the second logic gate is an XNOR gate, and the third logic gate is an OR gate, where the first input pin of the second logic gate is configured to acquire the second MPI information by using a system bus, the second input pin of the second logic gate is configured to acquire a first expected value by using the system bus, and the output pin of the second logic gate is configured to output a first operation result obtained after an operation is performed by the second logic gate on the second MPI information and the first expected value; and the second input pin of the third logic gate is configured to acquire a first comparison value by using the system bus, and the output pin of the third logic gate is configured to output a second operation result obtained after an operation is performed by the third logic gate on the first comparison value and the first operation result, where the second operation result is the filtering result, and $0 \leq k \leq 2^n-1$.

With reference to the second possible implementation manner of the first aspect, in a third possible implementation manner, the $j^{th}$ first logic gate in the $m^{th}$-level first logic gate circuit includes a first input pin of the $j^{th}$ first logic gate in the $m^{th}$-level first logic gate circuit, a second input pin of the $j^{th}$ first logic gate in the $m^{th}$-level first logic gate circuit, and an output pin of the $j^{th}$ first logic gate in the $m^{th}$-level first logic gate circuit, where $1 \leq j \leq 2^{n-m}$;

when m=1, the first input pin of the $j^{th}$ first logic gate in the first-level first logic gate circuit is connected to the output pin of the third logic gate in the $k^{th}$ bit filtering circuit, and the second input pin of the $j^{th}$ first logic gate in the first-level first logic gate circuit is connected to an output pin of the third logic gate in the $(k+1)^{th}$ bit filtering circuit, where k is an even number, the first input pin of the $j^{th}$ first logic gate in the first-level first logic gate circuit is configured to acquire the filtering result that is output by the $k^{th}$ bit filtering circuit, the second input pin of the $j^{th}$ first logic gate in the first-level first logic gate circuit is configured to acquire a filtering result that is output by the $(k+1)^{th}$ bit filtering circuit, and the output pin of the $j^{th}$ first logic gate in the first-level first logic gate circuit is configured to output a result obtained after an operation is performed by the $j^{th}$ first logic gate on the filtering result that is output by the $k^{th}$ bit filtering circuit and the filtering result that is output by the $(k+1)^{th}$ bit filtering circuit;

when $1 \leq m \leq n-1$, the output pin of the $j^{th}$ first logic gate in the $m^{th}$-level first logic gate circuit is connected to a first input pin of the $(j+1)/2^{th}$ first logic gate in the $(m+1)^{th}$-level first logic gate circuit, and an output pin of the $(j+1)^{th}$ first logic gate in the $m^{th}$-level first logic gate circuit is connected to a second input pin of the $(j+1)^{th}$ first logic gate in the $(m+1)^{th}$-level first logic gate circuit, where j is an odd number, the first input pin of the $(j+1)/2^{th}$ first logic gate in the $(m+1)^{th}$-level first logic gate circuit is configured to acquire a result that is output by the $j^{th}$ first logic gate in the $m^{th}$-level first logic gate circuit, the second input pin of the $(j+1)/2^{th}$ first logic gate in the $(m+1)^{th}$-level first logic gate circuit is configured to acquire a result that is output by the $(j+1)^{th}$ first logic gate in the $m^{th}$-level first logic gate circuit, and an output pin of the $(j+1)/2^{th}$ first logic gate in the $(m+1)^{th}$-level first logic gate circuit is configured to output a result obtained after an operation is performed by the $(j+1)/2^{th}$ first logic gate in the $(m+1)^{th}$-level first logic gate circuit on the result that is output by the $j^{th}$ first logic gate in the $m^{th}$-level first logic gate circuit and the result that is output by the $(j+1)^{th}$ first logic gate in the $m^{th}$-level first logic gate circuit; and when m=n-1, the output pin of the $(j+1)/2^{th}$ first logic gate in the $(m+1)^{th}$-level first logic gate circuit is connected to the read/write controller, where the result obtained after an operation is performed by the $(j+1)/2^{th}$ first logic gate in the $(m+1)^{th}$-level first logic gate circuit on the result that is output by the $j^{th}$ first logic gate in the $m^{th}$-level first logic gate circuit and the result that is output by the $(j+1)^{th}$ first logic gate in the $m^{th}$-level first logic gate circuit is a determining result, and the determining result is used to indicate whether the second MPI information is the first MPI information.

With reference to the foregoing first aspect or any one possible implementation manner of the first possible implementation manner to the third possible implementation manner of the first aspect, in a fourth possible implementation manner, the read/write controller includes a write module and a read module, the write module includes a summator and a first register configured to successively store, under a function of the summator, two pieces of first MPI information that are to be written into the memory and corresponding to the first service; and the read module includes a second register, configured to store the first MPI information that is from the address filter.

With reference to the foregoing first aspect or any one possible implementation manner of the first possible implementation manner to the fourth possible implementation manner of the first aspect, in a fifth possible implementation manner, the memory is specifically configured to store parity check data information, multiple pieces of MPI address information, and multiple pieces of MPI data information.

According to a second aspect, an embodiment of the present invention provides a monitoring method, including:

acquiring second microprocessor interface MPI information, a first comparison value, and a first expected value, where the first comparison value and the first expected value are separately corresponding to a first service that is preset;

determining, according to the second MPI information, the first comparison value, and the first expected value, whether the second MPI information is first MPI information, where the first MPI information is corresponding to the first service; and if the second MPI information is the first MPI information, saving the second MPI information, for locating an error point in the first MPI information delivered by a system chip.

In a first possible implementation manner of the second aspect, the second MPI information includes second MPI address information and second MPI data information that is corresponding to the second MPI address information, where the determining, according to the second MPI information, the first comparison value, and the first expected value, whether the second MPI information is the first MPI information specifically includes:

determining, according to the second MPI address information, the first comparison value, and the first expected value, whether the second MPI information is the first MPI information.

With reference to the first possible implementation manner of the second aspect, in a second possible implementation manner, the determining, according to the second MPI address information in the second MPI information, the first comparison value, and the first expected value, whether the second MPI information is the first MPI information specifically includes:

separately determining, according to a value of each bit in $2^n$ bits in the second MPI address information, a value of each bit in $2^n$ bits in the first comparison value, and a value of each bit in $2^n$ bits in the first expected value, $2^n$ filtering results corresponding to the $2^n$ bits in the second MPI address information, where $n \geq 1$; and determining, according to the $2^n$ filtering results, whether the second MPI information is the first MPI information.

With reference to the second possible implementation manner of the second aspect, in a third possible implementation manner, the separately determining, according to a value of each bit in $2^n$ bits in the second MPI address information, a value of each bit in $2^n$ bits in the first comparison value, and a value of each bit in $2^n$ bits in the first expected value, $2^n$ filtering results corresponding to the $2^n$ bits in the second MPI address information includes:

determining, according to a value of the $k^{th}$ bit in the first comparison value, whether to compare a value of the $k^{th}$ bit in the second MPI address information with a value of the $k^{th}$ bit in the first expected value, where $0 \leq k \leq 2^n - 1$; and if comparing the value of the $k^{th}$ bit in the second MPI address information with the value of the $k^{th}$ bit in the first expected value, outputting, according to a result of the comparing the value of the $k^{th}$ bit in the second MPI address information with the value of the $k^{th}$ bit in the first expected value, the $k^{th}$ filtering result corresponding to the $k^{th}$ bit in the second MPI address information; or if skipping comparing the value of the $k^{th}$ bit in the second MPI address information with the value of the $k^{th}$ bit in the first expected value, outputting the $k^{th}$ filtering result according to the value of the $k^{th}$ bit in the first comparison value.

With reference to the third possible implementation manner of the second aspect, in a fourth possible implementation manner, the determining, according to a value of the $k^{th}$ bit in the first comparison value, whether to compare a value of the $k^{th}$ bit in the second MPI address information with a value of the $k^{th}$ bit in the first expected value specifically includes:

comparing the value of the $k^{th}$ bit in the first comparison value with a first preset value; and if the value of the $k^{th}$ bit in the first comparison value is different from the first preset value, comparing the value of the $k^{th}$ bit in the second MPI address information with the value of the $k^{th}$ bit in the first expected value; or if the value of the $k^{th}$ bit in the first comparison value is the same as the first preset value, skipping comparing the value of the $k^{th}$ bit in the second MPI address information with the value of the $k^{th}$ bit in the first expected value.

With reference to any one possible implementation manner of the second possible implementation manner to the fourth possible implementation manner of the second aspect, in a fifth possible implementation manner, the determining, according to the $2^n$ filtering results, whether the second MPI information is the first MPI information specifically includes:

outputting a determining result according to the $2^n$ filtering results;

determining, according to the determining result, whether the second MPI information is the first MPI information; and if the determining result is the same as a second preset value, determining that the second MPI information is the first MPI information; or if the determining result is different from the second preset value, determining that the second MPI information is not the first MPI information.

With reference to the foregoing second aspect or any one possible implementation manner of the first possible implementation manner to the fifth possible implementation manner of the second aspect, in a sixth possible implementation manner, after the determining, according to the second MPI information, the first comparison value, and the first expected value, whether the second MPI information is the first MPI information, the method further includes:

if the second MPI information is not the first MPI information, skipping saving the second MPI information, so as to filter out the second MPI information.

According to a third aspect, an embodiment of the present invention provides an electronic device, including a system chip, a service chip, and a system bus, where the electronic device further includes the monitoring apparatus according to the foregoing first aspect or any one possible implementation manner of the first possible implementation manner to the fifth possible implementation manner of the first aspect, and the monitoring apparatus, the system chip, and the service chip are connected by using the system bus;

the system chip is configured to deliver the multiple pieces of MPI information to the service chip by using the system bus;

the service chip is configured to implement, based on each piece of MPI information in the multiple pieces of MPI information, a service corresponding to the MPI information; and the monitoring apparatus is configured to store the first MPI information that is used to monitor a first service.

In a first possible implementation manner of the third aspect, the system chip is connected to a first MPI interface of the service chip by using a second MPI interface.

According to a fourth aspect, an embodiment of the present invention further provides an electronic device, including a system chip, a service chip, and a system bus, where the service chip further includes the monitoring apparatus according to the foregoing first aspect or any one possible implementation manner of the first possible implementation manner to the fifth possible implementation manner of the first aspect, the system chip and the service chip are connected by using the system bus, the service chip includes at least one service module and a first MPI interface, the system chip is configured to deliver the multiple pieces of MPI information to the service chip by using the system bus, and the service chip is configured to implement, based on each piece of MPI information in the multiple pieces of MPI information, a service corresponding to the MPI information; and the monitoring apparatus is connected to the first MPI interface and the at least one service module by using the system bus, and is configured to store the first MPI information that is used to monitor a first service.

In a first possible implementation manner of the fourth aspect, a first input pin of a second logic gate in the $k^{th}$ bit filtering circuit in $2^n$ bit filtering circuits of the monitoring apparatus, a second input pin of the second logic gate, and a second input pin of a third logic gate in the $k^{th}$ bit filtering circuit are separately connected to the first MPI interface by using the system bus, where $n \geq 1$, and $0 \leq k \leq 2^n - 1$.

According to a fifth aspect, an embodiment of the present invention further provides an electronic device, including a system chip, a service chip, and a system bus, where the system chip further includes the monitoring apparatus according to the foregoing first aspect or any one possible implementation manner of the first possible implementation manner to the fifth possible implementation manner of the first aspect, the system chip and the service chip are connected by using the system bus, the system chip includes a central processing unit CPU core and a second MPI interface, the system chip is configured to deliver the multiple pieces of MPI information to the service chip by using the system bus, and the service chip is configured to implement, based on each piece of MPI information in the multiple pieces of MPI information, a service corresponding to the MPI information; and the monitoring apparatus is connected to the second MPI interface and the CPU core by using the system bus, and is configured to store the first MPI information that is used to monitor a first service.

In a first possible implementation manner of the fifth aspect, a first input pin of a second logic gate in the $k^{th}$ bit filtering circuit in $2^n$ bit filtering circuits of the monitoring apparatus, a second input pin of the second logic gate, and a second input pin of a third logic gate in the $k^{th}$ bit filtering circuit are separately connected to the second MPI interface by using the system bus.

The embodiments of the present invention provide a monitoring method, a monitoring apparatus, and an electronic device, where the monitoring apparatus includes an address filter, a read/write controller connected to the address filter, and a memory connected to the read/write controller. The address filter is configured to acquire multiple pieces of MPI information, and obtain, by filtering the multiple pieces of MPI information, first MPI information corresponding to a first service that is preset; the read/write controller is configured to write, into the memory according to a time sequence of receiving the first MPI information, the first MPI information that is obtained by the address filter by filtering; and the memory is configured to store the first MPI information written by the read/write controller. According to this solution, when a system chip delivers MPI information, the address filter obtains, by filtering, the first MPI information corresponding to the first service, and the first MPI information is stored in the memory according to a time sequence of receiving the MPI information; therefore, when an error occurs in the first service of a service chip, by using first service information stored in the monitoring apparatus, an error point in the MPI information delivered by the system chip can be accurately located, thereby improving efficiency of locating an error point in configuration of the service chip.

DESCRIPTION OF EMBODIMENTS

The following describes a monitoring method, a monitoring apparatus, and an electronic device according to embodiments of the present invention in detail with reference to accompanying drawings.

Embodiment 1

Figure 1:
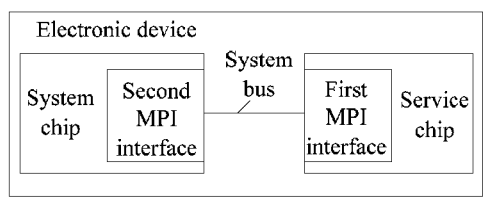
FIG. 1 is a schematic structural diagram of an electronic device according to the prior art.
Figure 2:
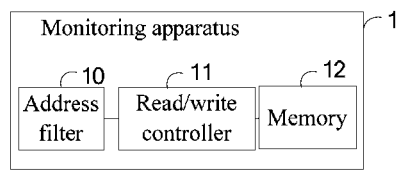
FIG. 2 is a first schematic structural diagram of a monitoring apparatus according to an embodiment of the present invention.

As shown in FIG. 2, the embodiment of the present invention provides a monitoring apparatus 1, including:

an address filter 10, a read/write controller 11 connected to the address filter 10, and a memory 12 connected to the read/write controller 11.

The address filter 10 is configured to acquire multiple pieces of microprocessor interface MPI information, and obtain, by filtering the multiple pieces of MPI information, first MPI information corresponding to a first service that is preset; the read/write controller 11 is configured to write, into the memory 12 according to a time sequence of receiving the first MPI information, the first MPI information that is obtained by the address filter 10 by filtering; and the memory 12 is configured to store the first MPI information written by the read/write controller 11.

It should be noted that the address filter 10 may obtain, by filtering the acquired multiple pieces of MPI information, the first MPI information corresponding to the first service, and the first MPI information is stored in the memory 12; therefore, if an error occurs when a service chip of an electronic device processes the first service, a test person may check the first MPI information stored in the memory 12 and corresponding to the first service, to accurately locate an error point in the first MPI information that is delivered by a system chip of the electronic device.

Optionally, each piece of MPI information includes one piece of MPI address information and one piece of MPI data information that is corresponding to the one piece of MPI address information, and the one piece of MPI address information includes $2^n$ bits, where $n \geq 1$.

Figure 3:
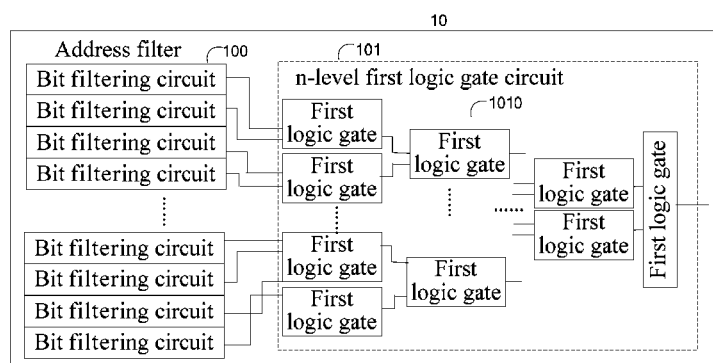
FIG. 3 is a second schematic structural diagram of a monitoring apparatus according to an embodiment of the present invention.

As shown in FIG. 3, the address filter 10 includes $2^n$ bit filtering circuits 100 and an n-level first logic gate circuit 101 that includes $2^n - 1$ first logic gates 1010, where the $m^{th}$-level first logic gate circuit in the n-level first logic gate circuit 101 includes $2^{n-m}$ first logic gates 1010, and the first logic gate 1010 is an OR gate or an AND gate, where $1 \leq m \leq n$, and $n > 1$.

The $2^n$ bit filtering circuits 100 are configured to separately acquire values of $2^n$ bits of second MPI address information in second MPI information, perform filtering on the values of the $2^n$ bits, and output $2^n$ filtering results, where the second MPI information is any one of the multiple pieces of MPI information. The n-level first logic gate circuit 101 is configured to determine, according to the $2^n$ filtering results, whether the second MPI information is the first MPI information.

It should be noted that implementation of the monitoring apparatus 1 provided in the embodiment of the present invention is implemented by a logic gate circuit; and in an actual application, an implementation manner of the monitoring apparatus 1 is not limited in the present invention.

The logic gate circuit is an electronic circuit that implements a basic and common logical operation. In a digital circuit, a "gate" is a circuit that can only implement a basic logical relationship. A logic gate is a basic component in an integrated circuit.

Further, the logic gate circuit may include: an AND gate, a NOT gate, an OR gate, an XNOR gate, an XOR gate, a NAND gate, a NOR gate, and the like.

Exemplarily, the AND gate is a logic gate that implements an AND logical operation. For example, when 0 and 1 are used as input of the AND gate, output of the AND gate is a result obtained after an AND operation is performed on 0 and 1, that is, 0.

It can be understood that each piece of MPI information includes one piece of MPI address information and one piece of MPI data information that is corresponding to the one piece of MPI address information, and the one piece of MPI address information includes $2^n$ bits; therefore, the first MPI information includes first MPI address information and first MPI data information, where the first MPI address information is corresponding to the first MPI data information, and the second MPI information includes second MPI address information and second MPI data information, where the second MPI address information is corresponding to the second MPI data information.

In particular, the number of bits of one piece of MPI address information is generally 32 or 64. In the embodiment of the present invention, the number of bits of the one piece of MPI address information is not limited.

Figure 4:
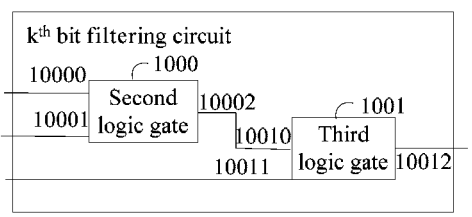
FIG. 4 is a third schematic structural diagram of a monitoring apparatus according to an embodiment of the present invention.

Optionally, as shown in FIG. 4, the $k^{th}$ bit filtering circuit in the $2^n$ bit filtering circuits 100 includes one second logic gate 1000 and one third logic gate 1001. The second logic gate 1000 includes a first input pin 10000, a second input pin 10001, and an output pin 10002 of the second logic gate 1000; and the third logic gate 1001 includes a first input pin 10010, a second input pin 10011, and an output pin 10012 of the third logic gate 1001, where the output pin 10002 of the second logic gate 1000 is connected to the first input pin 10010 of the third logic gate 1001, the second logic gate 1000 is an XOR gate or an XNOR gate, and the third logic gate 1001 is an AND gate or an OR gate, where $0 \leq k \leq 2^n - 1$.

When the first logic gate 1010 is an OR gate, the second logic gate 1000 is an XOR gate, and the third logic gate 1001 is an AND gate; or, when the first logic gate 1010 is an AND gate, the second logic gate 1000 is an XNOR gate, and the third logic gate 1001 is an OR gate.

The first input pin 10000 of the second logic gate 1000 is configured to acquire the second MPI information by using a system bus; the second input pin 10001 of the second logic gate 1000 is configured to acquire a first expected value by using the system bus; the output pin 10002 of the second logic gate 1000 is configured to output a first operation result obtained after an operation is performed by the second logic gate on the second MPI information and the first expected value.

The second input pin 10011 of the third logic gate 1001 is configured to acquire a first comparison value by using the system bus; the output pin 10012 of the third logic gate 1001 is configured to output a second operation result obtained after an operation is performed by the third logic gate 1001 on the first comparison value and the first operation result, where the second operation result is the filtering result.

Figure 5:
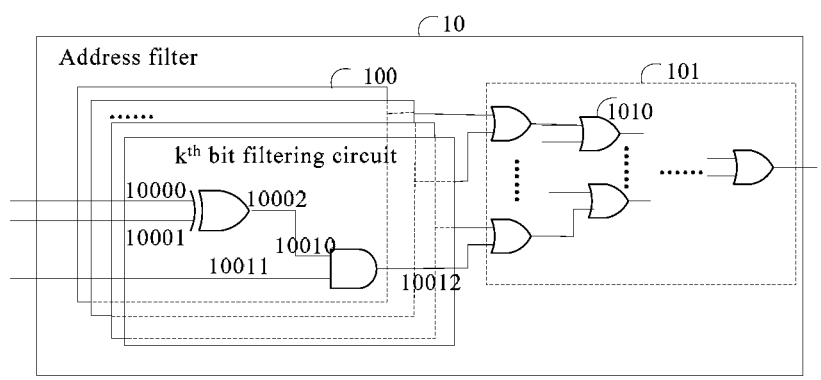
FIG. 5 is a fourth schematic structural diagram of a monitoring apparatus according to an embodiment of the present invention.
Figure 6:
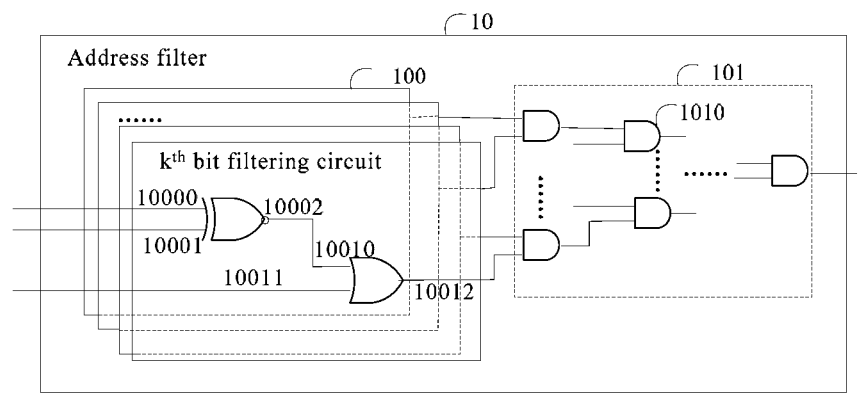
FIG. 6 is a fifth schematic structural diagram of a monitoring apparatus according to an embodiment of the present invention.

Further, when the first logic gate 1010 is an OR gate, the second logic gate 1000 is an XOR gate, and the third logic gate 1001 is an AND gate, a structural diagram of the address filter 10 is shown in FIG. 5; when the first logic gate 1010 is an AND gate, the second logic gate 1000 is an XNOR gate, and the third logic gate 1001 is an OR gate, a structural diagram of the address filter 10 is shown in FIG. 6.

It should be noted that one piece of MPI address information may include $2^n$ bits, and when the address filter 10 performs address filtering on the second MPI information, the address filter 10 performs filtering separately on each bit of the second MPI information; therefore, the address filtering circuit 10 includes $2^n$ bit filtering circuits.

It can be understood that the AND gate and the OR gate are inverse logic gates of each other, and the XNOR gate and the XOR gate are inverse logic gates of each other; therefore, in the embodiment of the present invention, the $k^{th}$ bit filtering circuit may be implemented by various types of circuits:

(1) When the first logic gate 1010 is an OR gate, the second logic gate 1000 is an XOR gate, and the third logic gate 1001 is an AND gate, the $k^{th}$ bit filtering circuit includes the XOR gate and the AND gate.

(2) When the first logic gate 1010 is an AND gate, the second logic gate 1000 is an XNOR gate, and the third logic gate 1001 is an OR gate, the $k^{th}$ bit filtering circuit includes the AND gate and the XNOR gate.

Further, in the embodiment of the present invention, the $k^{th}$ bit filtering circuit may further be formed by a logic component that may implement a function of the $k^{th}$ bit filtering circuit, which is not limited in the present invention.

Figure 7:
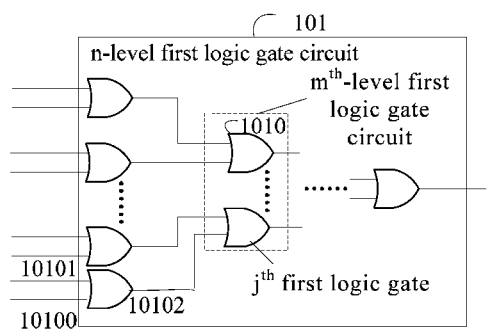
FIG. 7 is a sixth schematic structural diagram of a monitoring apparatus according to an embodiment of the present invention.
Figure 8:
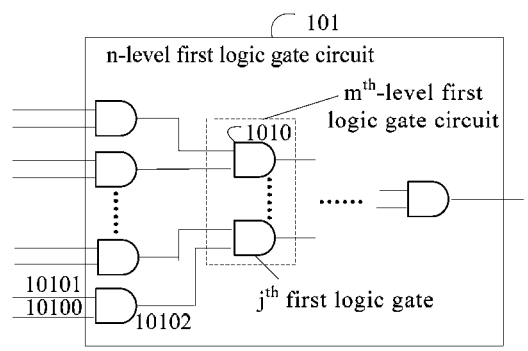
FIG. 8 is a seventh schematic structural diagram of a monitoring apparatus according to an embodiment of the present invention.

Optionally, it can be seen from FIG. 7 or FIG. 8 that the $j^{th}$ first logic gate 1010 in the $m^{th}$-level first logic gate circuit includes a first input pin 10100 of the $j^{th}$ first logic gate 1010 in the $m^{th}$-level first logic gate circuit, a second input pin

10101 of the $j^{th}$ first logic gate 1010 in the $m^{th}$-level first logic gate circuit, and an output pin 10102 of the $j^{th}$ first logic gate 1010 in the $m^{th}$-level first logic gate circuit, where $1 \leq j \leq 2^{n-m}$.

When m=1, the first input pin 10100 of the $j^{th}$ first logic gate 1010 in the first-level first logic gate circuit is connected to the output pin 10012 of the third logic gate 1001 in the $k^{th}$ bit filtering circuit, and the second input pin 10101 of the $j^{th}$ first logic gate 1010 in the first-level first logic gate circuit is connected to an output pin 10012 of the third logic gate 1001 in the $(k+1)^{th}$ bit filtering circuit, where k is an even number.

With reference to FIG. 5 and FIG. 7, or with reference to FIG. 6 and FIG. 8, the first input pin 10100 of the $j^{th}$ first logic gate 1010 in the first-level first logic gate circuit is configured to acquire the filtering result that is output by the $k^{th}$ bit filtering circuit; the second input pin 10101 of the $j^{th}$ first logic gate 1010 in the first-level first logic gate circuit is configured to acquire a filtering result that is output by the $(k+1)^{th}$ bit filtering circuit; the output pin 10102 of the $j^{th}$ first logic gate 1010 in the first-level first logic gate circuit is configured to output a result obtained after an operation is performed by the $j^{th}$ first logic gate on the filtering result that is output by the $k^{th}$ bit filtering circuit and the filtering result that is output by the $(k+1)^{th}$ bit filtering circuit.

When $1 \leq m \leq n-1$, the output pin 10102 of the $j^{th}$ first logic gate 1010 in the $m^{th}$-level first logic gate circuit is connected to a first input pin 10100 of the $(j+1)/2^{th}$ first logic gate 1010 in the $(m+1)^{th}$-level first logic gate circuit, and an output pin 10102 of the $(j+1)^{th}$ first logic gate 1010 in the $m^{th}$-level first logic gate circuit is connected to a second input pin 10101 of the $(j+1)2^{th}$ first logic gate 1010 in the $(m+1)^{th}$-level first logic gate circuit, where j is an odd number.

With reference to FIG. 5 and FIG. 7, or with reference to FIG. 6 and FIG. 8, the first input pin 10100 of the $(j^{+}1)/2^{th}$ first logic gate 1010 in the $(m+1)^{th}$-level first logic gate circuit is configured to acquire a result that is output by the $j^{th}$ first logic gate 1010 in the $m^{th}$-level first logic gate circuit; the second input pin 10101 of the $(j+1)/2^{th}$ first logic gate 1010 in the $(m+1)^{th}$-level first logic gate circuit is configured to acquire a result that is output by the $(j+1)^{th}$ first logic gate 1010 in the $m^{th}$-level first logic gate circuit; an output pin 10102 of the $(j+1)/2^{th}$ first logic gate 1010 in the $(m+1)^{th}$-level first logic gate circuit is configured to output a result obtained after an operation is performed by the $(j+1)/2^{th}$ first logic gate in the $(m+1)^{th}$-level first logic gate circuit on the result that is output by the $j^{th}$ first logic gate in the $m^{th}$-level first logic gate circuit and the result that is output by the $(j+1)^{th}$ first logic gate in the $m^{th}$-level first logic gate circuit.

When m=n-1, the output pin of the $(j+1)/2^{th}$ first logic gate 1010 in the $(m+1)^{th}$-level first logic gate circuit is connected to the read/write controller 11.

With reference to FIG. 5 and FIG. 7, or with reference to FIG. 6 and FIG. 8, the result obtained after an operation is performed by the $(j+1)/2^{th}$ first logic gate in the $(m+1)^{th}$-level first logic gate circuit on the result that is output by the $j^{th}$ first logic gate in the $m^{th}$-level first logic gate circuit and the result that is output by the $(j+1)^{th}$ first logic gate in the $m^{th}$-level first logic gate circuit is a determining result, where the determining result is used to indicate whether the second MPI information is the first MPI information.

It should be noted that, in the embodiment of the present invention, the first logic gate 1010 may be an OR gate, or may be an AND gate. FIG. 7 is a schematic structural diagram of the n-level first logic gate circuit in which the first logic gate 1010 is an OR gate, and FIG. 8 is a schematic structural diagram of the n-level first logic gate circuit in which the first logic gate 1010 is an AND gate.

It can be understood that a person skilled in the art may understand that, for any one piece of address information, a value of the address information is binary, and the value of the address information is called, from right to left, the $0^{th}$ bit, the $1^{st}$ bit, the $2^{nd}$ bit, the $3^{rd}$ bit, . . . , the $(2^n-2)^{th}$ bit, and the $(2^n-1)^{th}$ bit.

Preferably, the n-level first logic gate circuit 101 performs a first logic gate operation on a filtering result that is output by the $0^{th}$ bit filtering circuit and a filtering result that is output by the $1^{st}$ bit filtering circuit, performs a first logic gate operation on a filtering result that is output by the $2^{nd}$ bit filtering circuit and a filtering result that is output by the $3^{rd}$ bit filtering circuit, . . . , and performs a first logic gate operation on a filtering result that is output by the $(2^n-2)^{th}$ bit filtering circuit and a filtering result that is output by the $(2^n-1)^{th}$ bit filtering circuit.

Further, in the embodiment of the present invention, the n-level first logic gate circuit 101 is configured to perform the first logic gate operation on the $2^n$ filtering results, so as to determine whether the $2^n$ filtering results are the same as a second preset value; and specifically, that a first logic gate operation is performed on which two filtering results in the $2^n$ filtering results is not limited in the present invention.

Figure 9:
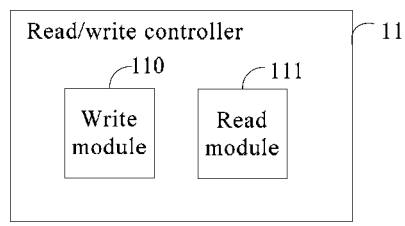
FIG. 9 is an eighth schematic structural diagram of a monitoring apparatus according to an embodiment of the present invention.
Figure 10:
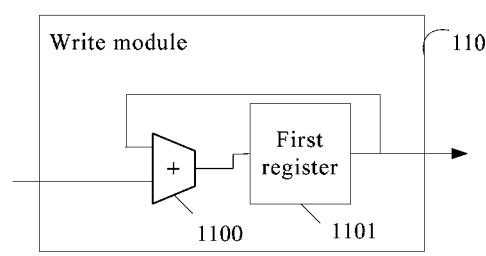
FIG. 10 is a ninth schematic structural diagram of a monitoring apparatus according to an embodiment of the present invention.
Figure 11:
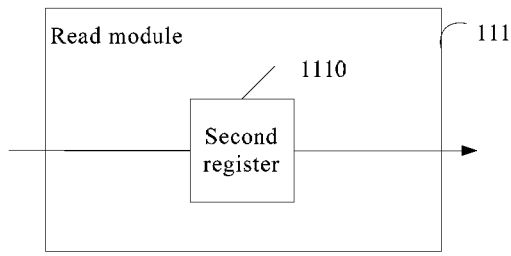
FIG. 11 is a tenth schematic structural diagram of a monitoring apparatus according to an embodiment of the present invention.

Optionally, as shown in FIG. 9, the read/write controller 11 includes a write module 110 and a read module 111; as shown in FIG. 10, the write module 110 includes a summator 1100 and a first register 1101 configured to successively store, under a function of the summator 1100, two pieces of first MPI information that are to be written into the memory 12 and corresponding to the first service; as shown in FIG. 11, the read module 111 includes a second register 1110, configured to store the first MPI information that is from the address filter 10.

Optionally, the memory 12 is specifically configured to store parity check data information, multiple pieces of MPI address information, and multiple pieces of MPI data information.

It should be noted that the first service may be corresponding to at least one piece of first MPI information. When the first service is corresponding to two pieces of first MPI information, the address filter 10 may obtain, by filtering, the two pieces of first MPI information; in this case, firstly, the write module 110 of the read/write controller 11 writes one piece of first MPI information into the first register 1101, then, the summator 1100 of the write module 110 increases by 1, and finally, the write module 110 writes the other piece of first MPI information into the first register 1101. In this way, the monitoring apparatus 1 may store first information obtained by means of filtering in the memory 11 according to a time sequence of receiving.

Figure 12:
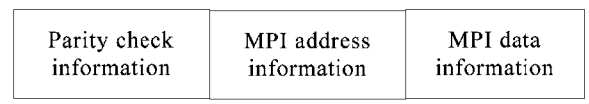
FIG. 12 is a schematic diagram of a storage structure of a memory of a monitoring apparatus according to an embodiment of the present invention.

Exemplarily, FIG. 12 shows a storage format of internal data of the memory 12, where the parity check data information is used to ensure correctness of stored data. MPI address information and MPI data information are the first MPI address information and the first MPI data information of the first MPI information that is obtained by the address filter 10 by filtering.

Further, the system chip delivers configuration information to the service chip, to configure an address register of the service chip, so that the service chip may implement a service after configuration of the address register is complete, where the address register is an address register of the service. The MPI address information is an address of an address register that is in the configuration information delivered by the system chip, and the MPI data information is a configuration value in the configuration information delivered by the system chip.

Figure 13:
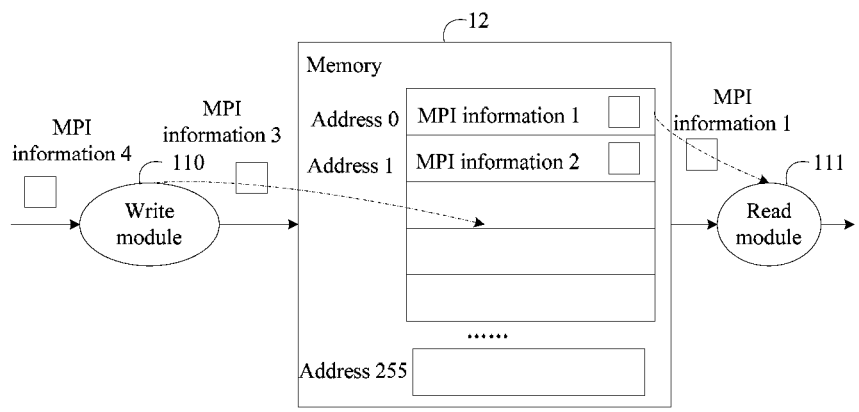
FIG. 13 is an eleventh schematic structural diagram of a monitoring apparatus according to an embodiment of the present invention.

It should be noted that the second MPI information is any one of the multiple pieces of MPI information that are acquired by the monitoring apparatus 1. As shown in FIG. 13, when storing multiple pieces of second MPI information, the memory 12 of the monitoring apparatus 1 saves the multiple pieces of second MPI information according to a time sequence of receiving the multiple pieces of second MPI information.

Further, the write module 110 and the read module 111 are separately connected to the memory 12.

In particular, when an error occurs in the first service, a test person may not only check whether content of a piece of second MPI information delivered by the system chip is correct, but also check whether a time sequence of the multiple pieces of second MPI information delivered by the system chip is correct, thereby improving efficiency of accurately locating an error point that occurs when the system chip delivers the first MPI information.

The embodiment of the present invention provides a monitoring apparatus, where the monitoring apparatus includes an address filter, a read/write controller connected to the address filter, and a memory connected to the read/write controller. The address filter is configured to acquire multiple pieces of MPI information, and obtain, by filtering the multiple pieces of MPI information, first MPI information corresponding to a first service that is preset; the read/write controller is configured to write, into the memory according to a time sequence of receiving the first MPI information, the first MPI information that is obtained by the address filter by filtering; and the memory is configured to store the first MPI information written by the read/write controller. According to this solution, when a system chip delivers MPI information, the address filter obtains, by filtering, the first MPI information corresponding to the first service, and the first MPI information is stored in the memory according to a time sequence of receiving the MPI information; therefore, when an error occurs in the first service of a service chip, by using first service information stored in the monitoring apparatus, an error point in the MPI information delivered by the system chip can be accurately located, thereby improving efficiency of locating an error point in configuration of the service chip.

Embodiment 2

Figure 14:
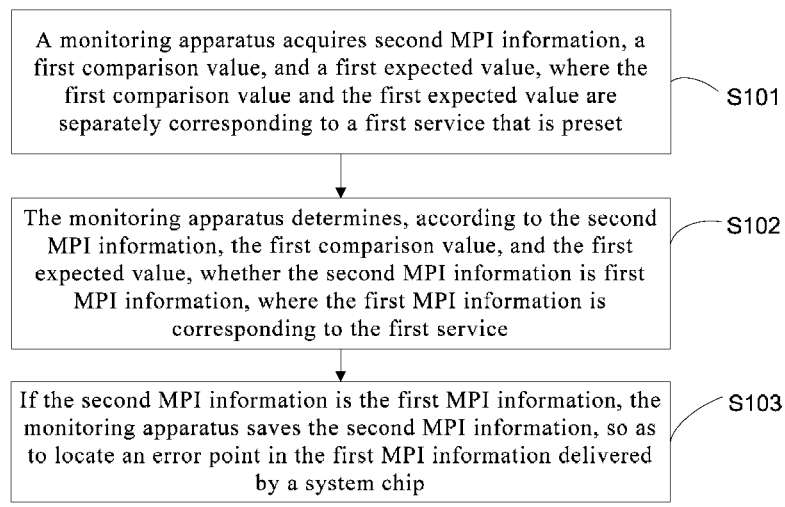
FIG. 14 is a first flowchart of a monitoring method according to an embodiment of the present invention.

The embodiment of the present invention provides a monitoring method. As shown in FIG. 14, the method may include:

S101: A monitoring apparatus acquires second MPI (Micro Process Interface, microprocessor interface) information, a first comparison value, and a first expected value, where the first comparison value and the first expected value are separately corresponding to a first service that is preset.

It should be noted that the monitoring apparatus may acquire multiple pieces of MPI information by using a system bus, and the second MPI information is any one of the multiple pieces of MPI information.

In the embodiment of the present invention, the monitoring apparatus performs monitoring on the acquired multiple pieces of MPI information one by one.

The monitoring apparatus acquires the second MPI information, the first comparison value, and the first expected value, where the first comparison value and the first expected value are separately set according to the first service that is preset.

It should be noted that the monitoring apparatus provided in the embodiment of the present invention is applied to monitoring of configuration information when a system chip in an electronic device delivers service configuration information to a service chip; communication between the system chip and the service chip is implemented by using an MPI interface, and therefore the configuration information in the embodiment of the present invention may include at least one piece of first MPI information.

The system chip may be an SOC (System on Chip, system on chip) chip, where the SOC chip includes a CPU (Central Processing Unit, central processing unit) core that supports an RISC (Reduced Instruction Set Computer, reduced instruction set computer) instruction structure inside, for example, a common ARM (Acorn RISC Machine, RISC microprocessor) core. The SOC chip supports service software running inside. The service chip is an ASIC (Application Specific Integrated Circuits, application-specific integrated circuit) that supports specific service processing, for example, an ASIC that supports ONT (Optical network terminal, optical network terminal) service processing, and the service chip does not include a CPU core inside. A software configuration interface between the SOC chip and the service chip is an MPI interface; currently, a commonly-used MPI interface includes a PCIe (PCI Express) bus interface, an AMBA (Advanced Microcontroller Bus Architecture) bus interface, and the like.

Specifically, the second MPI information, the first comparison value, and the first expected value are delivered by the system chip. The monitoring apparatus may acquire, by using the system bus, the second MPI information, the first comparison value, and the first expected value that are delivered by the system chip.

Further, the first comparison value and the first expected value are configured by the system chip according to the at least one piece of first MPI information that is corresponding to the first service, and the first comparison value and the first expected value are reference values for determining whether the second MPI information is the first MPI information. A specific determining method in the monitoring method provided in the embodiment of the present invention is described in a later part of the embodiment of the present invention.

It should be noted that the monitoring apparatus may obtain, by filtering the acquired multiple pieces of MPI information, the first MPI information corresponding to the first service, and the first MPI information is stored in a memory of the monitoring apparatus; therefore, if an error occurs when the service chip of the electronic device processes the first service, a test person may check the first MPI information that is stored in the memory of the monitoring apparatus and is corresponding to the first service, to accurately locate an error point in the first MPI information that is delivered by the system chip of the electronic device.

Optionally, each piece of MPI information includes one piece of MPI address information and one piece of MPI data information that is corresponding to the one piece of MPI address information, and the one piece of MPI address information includes $2^n$ bits, where $n \geq 1$.

It can be understood that each piece of MPI information includes one piece of MPI address information and one piece of MPI data information that is corresponding to the one piece of MPI address information, and the one piece of MPI address information includes $2^n$ bits; therefore, the first MPI information includes first MPI address information and first MPI data information, where the first MPI address information is corresponding to the first MPI data information, and the second MPI information includes second MPI address information and second MPI data information, where the second MPI address information is corresponding to the second MPI data information.

It should be known that the number of bits of one piece of MPI address information is generally 32 or 64. In the embodiment of the present invention, the number of bits of the one piece of MPI address information is not limited.

It should be noted that the one piece of MPI address information may include $2^n$ bits, and when the monitoring apparatus performs address filtering on the second MPI information, the monitoring apparatus performs filtering separately on each bit of the second MPI information; therefore, the monitoring apparatus includes $2^n$ bit filtering circuits.

It should be noted that implementation of the monitoring apparatus corresponding to the monitoring method provided in the embodiment of the present invention is implemented by a logic gate circuit; and in an actual application, an implementation manner of the monitoring apparatus is not limited in the present invention.

The logic gate circuit is an electronic circuit that implements a basic and common logical operation. In a digital circuit, a "gate" is a circuit that can only implement a basic logical relationship. A logic gate is a basic component in an integrated circuit.

Further, the logic gate circuit may include: an AND gate, a NOT gate, an OR gate, an XNOR gate, an XOR gate, a NAND gate, a NOR gate, and the like.

Exemplarily, the AND gate is a logic gate that implements an AND logical operation. For example, when 0 and 1 are used as input of the AND gate, output of the AND gate is a result obtained after an AND operation is performed on 0 and 1, that is, 0.

It can be understood that the AND gate and the OR gate are inverse logic gates of each other, and the XNOR gate and the XOR gate are inverse logic gates of each other; therefore, in the embodiment of the present invention, a bit filtering circuit may be implemented by various types of circuits.

In particular, an entity that executes the monitoring method provided in the embodiment of the present invention may be a monitoring apparatus, where the monitoring apparatus may be an electronic device, or may be an independent module connected to an electronic device, and a specific implementation manner is not limited in the present invention.

Exemplarily, the monitoring apparatus acquires the second MPI information, the first comparison value and the first expected value, where second address information in the second MPI information is 0001, the second MPI data information in the second MPI information is A, the first comparison value is 1110, and the first expected value is 0000.

S102: The monitoring apparatus determines, according to the second MPI information, the first comparison value, and the first expected value, whether the second MPI information is first MPI information, where the first MPI information is corresponding to the first service.

After the monitoring apparatus acquires the second MPI information, the first comparison value, and the first expected value, the monitoring apparatus determines, according to the second MPI information, the first comparison value, and the first expected value, whether the second MPI information is the first MPI information, where the first MPI information is corresponding to the first service, that is, the monitoring apparatus determines whether the second MPI information is MPI information corresponding to the first service.

It should be noted that the first MPI information is any one piece of configuration information that is delivered by the system chip in the electronic device to the service chip, where the configuration information is corresponding to the first service of the service chip, that is, the first MPI information is configuration information of the first service. The first MPI information may be acquired by the monitoring apparatus by using the system bus.

Optionally, the first service may be any one of services that can be processed by the service chip in the electronic device.

Further, first comparison values and first expected values corresponding to different first services are different. Because a first comparison value and a first expected value are separately corresponding to a first service, the monitoring apparatus may compare the second MPI information with the first comparison value and the first expected value, to determine whether the second MPI information is the first MPI information.

In particular, when the service chip performs first service configuration, the monitoring apparatus may obtain, by filtering, the first MPI information corresponding to the first service, that is, the monitoring apparatus monitors the configuration information of the first service.

It should be noted that a process of filtering the first MPI information by the monitoring apparatus is implemented by an address filter in the monitoring apparatus.

S103: If the second MPI information is the first MPI information, the monitoring apparatus saves the second MPI information, which may be checked at the time of locating an error point in the first MPI information delivered by a system chip.

After the monitoring apparatus determines, according to the second MPI information, the first comparison value, and the first expected value, whether the second MPI information is the first MPI information, if the second MPI information is the first MPI information, the monitoring apparatus saves the second MPI information, for locating an error point in the first MPI information delivered by the system chip.

Specifically, if the second MPI information is the first MPI information, the monitoring apparatus writes, by using its internal read/write controller, the second MPI information into the memory inside the monitoring apparatus, so as to save the second MPI information, which may be checked at the time of locating an error point in the first MPI information delivered by the system chip.

It can be understood that, when the monitoring apparatus determines that the second MPI information is the first MPI information, the monitoring apparatus records the second MPI information. In this way, if an error occurs when the service chip processes the first service, a test person may check the second MPI information, namely, the first MPI information corresponding to the first service, stored in the monitoring apparatus to accurately determine whether an error occurs when the system chip delivers the first MPI information, so as to locate an error point in the first MPI information delivered by the system chip.

According to the monitoring method provided in the embodiment of the present invention, a monitoring apparatus acquires second MPI information, a first comparison value, and a first expected value, where the first comparison value and the first expected value are separately corresponding to a first service that is preset; the monitoring apparatus determines, according to the second MPI information, the first comparison value, and the first expected value, whether the second MPI information is first MPI information, where the first MPI information is corresponding to the first service; if the second MPI information is the first MPI information, the monitoring apparatus saves the second MPI information, which may be checked at the time of locating an error point in the first MPI information delivered by a system chip. According to this solution, when the system chip delivers MPI information, an address filter obtains, by filtering, the first MPI information corresponding to the first service, and the first MPI information is stored in a memory according to a time sequence of receiving the MPI information; therefore, when an error occurs in the first service of a service chip, by using first service information stored in the monitoring apparatus, an error point in the MPI information delivered by the system chip can be accurately located, thereby improving efficiency of locating an error point in configuration of the service chip.

Embodiment 3

Figure 15:
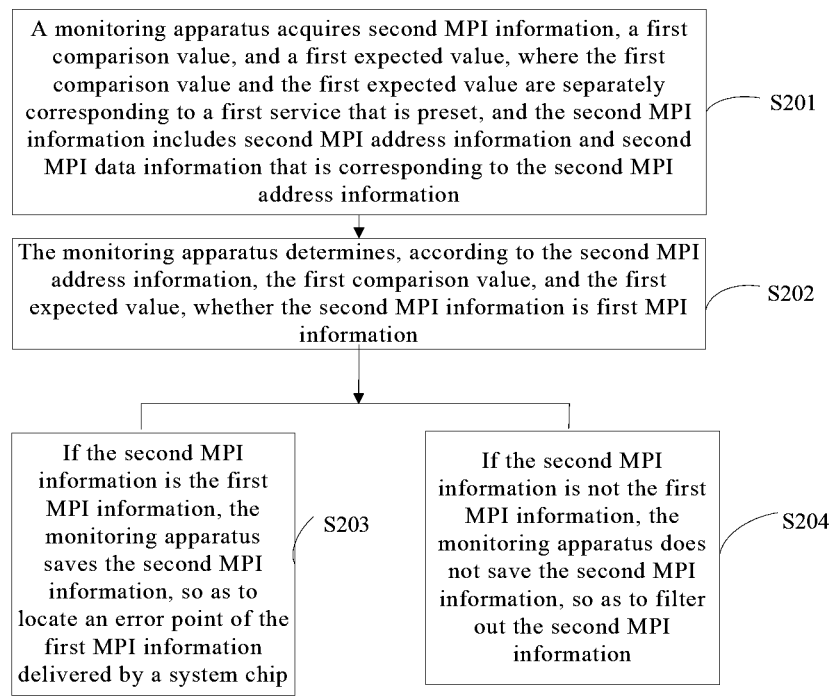
FIG. 15 is a second flowchart of a monitoring method according to an embodiment of the present invention.

The embodiment of the present invention provides a monitoring method. As shown in FIG. 15, the method may include:

S201: A monitoring apparatus acquires second microprocessor interface MPI information, a first comparison value, and a first expected value, where the first comparison value and the first expected value are separately corresponding to a first service that is preset, and the second MPI information includes second MPI address information and second MPI data information that is corresponding to the second MPI address information.

It should be noted that the monitoring apparatus may acquire multiple pieces of MPI information by using a system bus, and the second MPI information is any one of the multiple pieces of MPI information.

In the embodiment of the present invention, the monitoring apparatus performs monitoring on the acquired multiple pieces of MPI information one by one.

The monitoring apparatus acquires the second MPI information, the first comparison value, and the first expected value, where the first comparison value and the first expected value are separately set according to the first service that is preset, and the second MPI information includes the second MPI address information and the second MPI data information that is corresponding to the second MPI address information.

It should be noted that the monitoring apparatus provided in the embodiment of the present invention is applied to monitoring of configuration information when a system chip in an electronic device delivers service configuration information to a service chip; communication between the system chip and the service chip is implemented by using an MPI interface, and therefore the configuration information in the embodiment of the present invention includes at least one piece of first MPI information.

The system chip may be an SOC chip, where the SOC chip includes a CPU core that supports an RISC instruction structure inside, for example, a common ARM core. The SOC chip supports service software running inside. The service chip is an ASIC that supports service processing, for example, an ASIC that supports ONT service processing, and the service chip does not include a CPU core inside. A software configuration interface between the SOC chip and the service chip is an MPI interface; currently, a commonly-used MPI interface includes a PCIe bus interface, an AMBA bus interface, and the like.

Specifically, the second MPI information, the first comparison value, and the first expected value are delivered by the system chip. The monitoring apparatus may acquire, by using the system bus, the second MPI information, the first comparison value, and the first expected value that are delivered by the system chip.

Further, the first comparison value and the first expected value are configured by the system chip according to the at least one piece of first MPI information that is corresponding to the first service, and the first comparison value and the first expected value are determining reference values for determining whether the second MPI information is the first MPI information. A specific determining method in the monitoring method provided in the embodiment of the present invention is described in detail in a later part of the embodiment of the present invention.

It should be noted that the monitoring apparatus may obtain, by filtering the acquired multiple pieces of MPI information, the first MPI information corresponding to the first service, and the first MPI information is stored in a memory of the monitoring apparatus; therefore, if an error occurs when the service chip of the electronic device processes the first service, a test person may check the first MPI information that is stored in the memory of the monitoring apparatus and is corresponding to the first service, to accurately locate an error point in the first MPI information that is delivered by the system chip of the electronic device.

In particular, an entity that executes the monitoring method provided in the embodiment of the present invention may be a monitoring apparatus, where the monitoring apparatus may be an electronic device, or may be an independent module connected to an electronic device, and a specific implementation manner is not limited in the present invention.

S202: The monitoring apparatus determines, according to the second MPI information, the first comparison value, and the first expected value, whether the second MPI information is first MPI information.

After the monitoring apparatus acquires the second MPI information, the first comparison value, and the first expected value, the monitoring apparatus determines, according to the second MPI information, the first comparison value, and the first expected value, whether the second MPI information is the first MPI information, where the first MPI information is corresponding to the first service, that is, the monitoring apparatus determines whether the second MPI information is MPI information corresponding to the first service.

It should be noted that the first MPI information is any one piece of configuration information that is delivered by the system chip in the electronic device to the service chip, where the configuration information is corresponding to the first service of the service chip, that is, the first MPI information is configuration information of the first service. The first MPI information may be acquired by the monitoring apparatus by using the system bus.

Optionally, the first service may be any one of services that can be processed by the service chip in the electronic device.

Further, first comparison values and first expected values corresponding to different first services are different. Because a first comparison value and a first expected value are separately corresponding to a first service, the monitoring apparatus may compare the second MPI information with the first comparison value and the first expected value, to determine whether the second MPI information is the first MPI information.

In particular, when the service chip performs first service configuration, the monitoring apparatus may obtain, by filtering, the first MPI information corresponding to the first service, that is, the monitoring apparatus monitors the configuration information of the first service.

Figure 16:
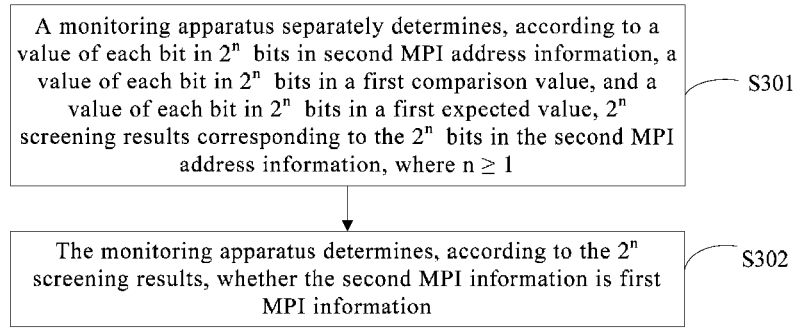
FIG. 16 is a third flowchart of a monitoring method according to an embodiment of the present invention.

Specifically, as shown in FIG. 16, the steps of determining, by the monitoring apparatus according to the second MPI information, the first comparison value, and the first expected value, whether the second MPI information is the first MPI information include the following S301 to S302.

S301: The monitoring apparatus separately determines, according to a value of each bit in $2^n$ bits in the second MPI address information, a value of each bit in $2^n$ bits in the first comparison value, and a value of each bit in $2^n$ bits in the first expected value, $2^n$ filtering results corresponding to the $2^n$ bits in the second MPI address information, where $n \geq 1$.

Optionally, each piece of MPI information includes one piece of MPI address information and one piece of MPI data information that is corresponding to the one piece of MPI address information, where the one piece of MPI address information includes $2^n$ bits, where $n \geq 1$, that is, the second MPI address information includes $2^n$ bits, and the first comparison value and the first expected value are address information and include the same number of bits, namely, $2^n$ bits, as the second MPI information.

It can be understood that each piece of MPI information includes one piece of MPI address information and one piece of MPI data information that is corresponding to the one piece of MPI address information, and the one piece of MPI address information includes $2^n$ bits; therefore, the first MPI information includes first MPI address information and first MPI data information, where the first MPI address information is corresponding to the first MPI data information, and the second MPI information includes the second MPI address information and the second MPI data information, where the second MPI address information is corresponding to the second MPI data information.

It should be known that the number of bits of one piece of MPI address information is generally 32 or 64. In the embodiment of the present invention, the number of bits of the one piece of MPI address information is not limited.

It should be noted that, when the monitoring apparatus determines whether the second MPI information is the first MPI information, the monitoring apparatus performs the determining by using each bit, that is, the monitoring apparatus determines, according to a value of one bit in the $2^n$ bits in the second MPI address information, a value of one bit in the $2^n$ bits in the first comparison value, and a value of one bit in the $2^n$ bits in the first expected value, one filtering result corresponding to the bit in the second MPI address information. It can be deduced that a method for determining a filtering result corresponding to each bit in the second MPI address information is the same as the method for determining one bit in the foregoing second MPI address information.

In particular, a value of a bit of the second MPI address information, a value of a bit of the first comparison value, and a value of a bit of the first expected value are all binary, including 0 or 1, that is, the second address information, the first comparison value, and the first expected value are a combination of $2^n$ 0/1s separately. Both the first comparison value and the first expected value are address information.

Exemplarily, when n=2, $2^n$=4, and the second MPI address information may be 0001, the first comparison value may be 0001, and the first expected value may be 0000.

It should be noted that a person skilled in the art may understand that, for any one piece of address information, a value of the address information is binary, and the value of the address information is called, from right to left, the $0^{th}$ bit, the $1^{st}$ bit, the $2^{nd}$ bit, ..., and the $(2^n-1)^{th}$ bit.

Further, values of the first comparison value and the first expected value are determined according to the configuration information of the first service. A specific method for determining the values of the first comparison value and the first expected value is described in a later part of the embodiment of the present invention.

It should be noted that a process of determining, by the monitoring apparatus, the $2^n$ filtering results corresponding to the $2^n$ bits in the second MPI address information is implemented in a bit filtering circuit in an address filter of the monitoring apparatus, where one bit is corresponding to one bit filtering circuit, and each bit filtering circuit outputs one filtering result. In the embodiment of the present invention, because implementation of one bit filtering circuit is implemented by a logic gate circuit, the filtering result may be 0, or may be 1.

Figure 17:
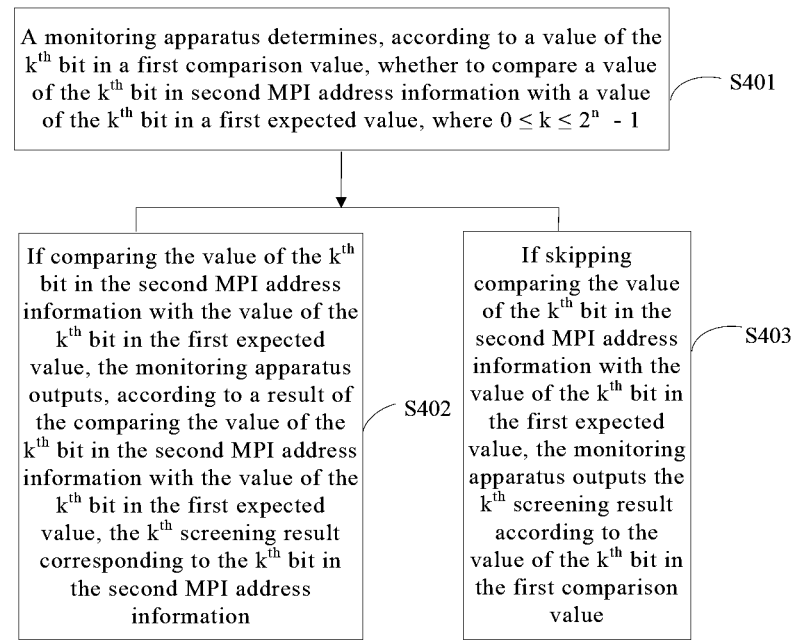
FIG. 17 is a fourth flowchart of a monitoring method according to an embodiment of the present invention.

Further, as shown in FIG. 17, that the monitoring apparatus separately determines, according to a value of each bit in the second MPI address information, a value of each bit in $2^n$ bits in the first comparison value, and a value of each bit in $2^n$ bits in the first expected value, $2^n$ filtering results corresponding to the $2^n$ bits in the second MPI address information includes the following S401 to S403.

S401: The monitoring apparatus determines, according to a value of the $k^{th}$ bit in the first comparison value, whether to compare a value of the $k^{th}$ bit in the second MPI address information with a value of the $k^{th}$ bit in the first expected value, where $0 \leq k \leq 2^n-1$.

In the embodiment of the present invention, the monitoring apparatus determines, according to the value of the $k^{th}$ bit in the first comparison value, whether to compare the value of the $k^{th}$ bit in the second MPI address information with the value of the $k^{th}$ bit in the first expected value.

It should be noted that there may be at least one piece of first MPI information that is corresponding to the first service, and a value of the first comparison value is determined based on all first MPI information corresponding to the first service, and in particular, is determined based on all first MPI address information of all the first MPI information corresponding to the first service.

The following uses an example to describe a method for determining the values of the first comparison value and the first expected value.

Exemplarily, when n=2, $2^n$=4, and the configuration information corresponding to the first service is MPI information 1, MPI information 2, and MPI information 3, where MPI information 1, MPI information 2, and MPI information 3 are three pieces of first MPI information. Address information of MPI information 1 is 0001, address information of MPI information 2 is 0000, and address information of MPI information 3 is 0010. It can be deduced from the foregoing information that, in the address information of MPI information 1, address information of MPI information 2, and address information of MPI information 3, only values of the $0^{th}$ bit and values of the $1^{st}$ bit are different, that is, in the monitoring apparatus, a value of the $0^{th}$ bit and a value of the $1^{st}$ bit in the second MPI address information may be 0 or 1; therefore, the monitoring apparatus mainly compares values of the $2^{nd}$ bit and values of the $3^{rd}$ bit. Consequently, a value of the $0^{th}$ bit and a value of the $1^{st}$ bit of the first comparison value delivered by the system chip are values same as a first preset value, and a value of the $2^{nd}$ bit and a value of the $3^{rd}$ bit of the first comparison value are values inverse to the first preset value; that is, if the first preset value is 0, a value inverse to the first preset value is 1, and if the first preset value is 1, the value inverse to the first preset value is 0. Assuming that the first preset value is 0, the first comparison value is 1100. Setting of the first preset value is related to a specific circuit that implements the monitoring apparatus. The first expected value is any one of the address information of MPI information 1, address information of MPI information 2, and address information of MPI information 3, that is, a value of the $0^{th}$ bit and a value of the $1^{st}$ bit of the first expected value may be 0 or 1, but a value of the $2^{nd}$ bit and a value of the $3^{rd}$ bit are the same as a value of the $2^{nd}$ bit and a value of the $3^{rd}$ bit in the address information of MPI information 1, address information of MPI information 2, and address information of MPI information 3, for example, 0010.

Optionally, (1) when the $k^{th}$ bit filtering circuit in the address filter of the monitoring apparatus includes an XOR gate and an AND gate, the first preset value is 0; and (2) when the $k^{th}$ bit filtering circuit in the address filter of the monitoring apparatus includes an XNOR gate and an OR gate, the first preset value is 1.

It can be understood that because in the embodiment of the present invention, the monitoring apparatus may first determine, according to the first comparison value, a bit, of which a value may not be considered, in the second address information, that is, a first bit, which is different from the first preset value, of the first comparison value; and then compares a value of the first bit in the second address information with that in the first expected value, so as to determine whether the value of the first bit is the same as that of a second bit, where the second bits are bits of which values in all first MPI information are the same. Therefore, for the value of the $k^{th}$ bit in the second MPI address information, the monitoring apparatus may determine, according to the value of the $k^{th}$ bit in the first comparison value, whether to compare the value of the $k^{th}$ bit in the second MPI address information with the value of the $k^{th}$ bit in the first expected value.

Figure 18:
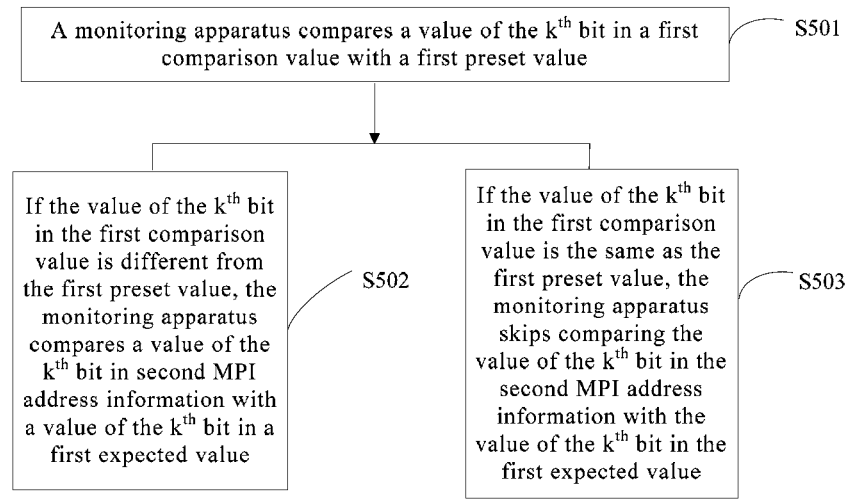
FIG. 18 is a fifth flowchart of a monitoring method according to an embodiment of the present invention.

Specifically, as shown in FIG. 18, that the monitoring apparatus determines, according to the value of the $k^{th}$ bit in the first comparison value, whether to compare the value of the $k^{th}$ bit in the second MPI address information with the value of the $k^{th}$ bit in the first expected value includes the following S501 to S503.

S501: The monitoring apparatus compares the value of the $k^{th}$ bit in the first comparison value with a first preset value.

The monitoring apparatus compares the value of the $k^{th}$ bit in the first comparison value with the first preset value, to determine whether the value of the $k^{th}$ bit in the second MPI information needs to be determined.

Exemplarily, when n=2, $2^n$=4, and the configuration information corresponding to the first service is MPI information 1 and MPI information 2, where MPI information 1 and MPI information 2 are two pieces of first MPI information. Assuming that address information of MPI information 1 is 0001, and address information of MPI information 2 is 0000, the first comparison value is 1110. If the first preset value is 0, when k=0, the value 0 of the $0^{th}$ bit of the first comparison value is compared with the first preset value 0; and when k=1, the value 1 of the $1^{st}$ bit of the first comparison value is compared with the first preset value 0.

S502: If the value of the $k^{th}$ bit in the first comparison value is different from the first preset value, the monitoring apparatus compares the value of the $k^{th}$ bit in the second MPI address information with the value of the $k^{th}$ bit in the first expected value.

After the monitoring apparatus compares the value of the $k^{th}$ bit in the first comparison value with the first preset value, if the value of the $k^{th}$ bit in the first comparison value is different from the first preset value, the monitoring apparatus compares the value of the $k^{th}$ bit in the second MPI address information with the value of the $k^{th}$ bit in the first expected value.

It should be noted that, if the value of the $k^{th}$ bit in the first comparison value is different from the first preset value, it indicates that only if the value of the $k^{th}$ bit in the second address information is the same as the value of the $k^{th}$ bit in the first expected value, the value of the $k^{th}$ bit in the second address information can be the same as a value of the $k^{th}$ bit in the first MPI address information; therefore, the monitoring apparatus needs to compare the value of the $k^{th}$ bit in the second MPI address information with the value of the $k^{th}$ bit in the first expected value.

Exemplarily, when n=2, $2^n$=4, and the configuration information corresponding to the first service is MPI information 1 and MPI information 2, where MPI information 1 and MPI information 2 are two pieces of first MPI information. Assuming that address information of MPI information 1 is 0001, and address information of MPI information 2 is 0000, the first comparison value is 1110, and the first expected value is 0001; if the second MPI address information is 0010, and the first preset value is 0, when k=1, a value of the $1^{st}$ bit of the first comparison value is 1, which is different from the first preset value 0; therefore, the monitoring apparatus compares the value 1 of the $1^{st}$ bit in the second MPI address information with the value 0 of the $1^{st}$ bit in the first expected value.

S503: If the value of the $k^{th}$ bit in the first comparison value is the same as the first preset value, the monitoring apparatus skips comparing the value of the $k^{th}$ bit in the second MPI address information with the value of the $k^{th}$ bit in the first expected value.

After the monitoring apparatus compares the value of the $k^{th}$ bit in the first comparison value with the first preset value, if the value of the $k^{th}$ bit in the first comparison value is the same as the first preset value, the monitoring apparatus skips comparing the value of the $k^{th}$ bit in the second MPI address information with the value of the $k^{th}$ bit in the first expected value.

Exemplarily, when n=2, $2^n$=4, and the configuration information corresponding to the first service is MPI information 1 and MPI information 2, where MPI information 1 and MPI information 2 are two pieces of first MPI information. Assuming that address information of MPI information 1 is 0001, and address information of MPI information 2 is 0000, the first comparison value is 1110, and the first expected value is 0001; if the second MPI address information is 0010, and the first preset value is 0, when k=0, a value of the $0^{th}$ bit of the first comparison value is 0, which is the same as the first preset value 0; therefore, the monitoring apparatus skips comparing the value 0 of the $0^{th}$ bit in the second MPI address information with the value 0 of the $0^{th}$ bit in the first expected value.

It should be noted that, in the embodiment of the present invention, S502 and S503 are two parallel steps after S501; and an execution sequence of S502 and S503 is not limited in the present invention, that is, the monitoring apparatus may first execute S501 and S502, and then execute S503, or may first execute S501 and S503, and then execute S502, which is not limited in the present invention.

S402: If comparing the value of the $k^{th}$ bit in the second MPI address information with the value of the $k^{th}$ bit in the first expected value, the monitoring apparatus outputs, according to a result of the comparing the value of the $k^{th}$ bit in the second MPI address information with the value of the $k^{th}$ bit in the first expected value, the $k^{th}$ filtering result corresponding to the $k^{th}$ bit in the second MPI address information.

After the monitoring apparatus determines, according to the value of the $k^{th}$ bit in the first comparison value, whether to compare the value of the $k^{th}$ bit in the second MPI address information with the value of the $k^{th}$ bit in the first expected value, if comparing the value of the $k^{th}$ bit in the second MPI address information with the value of the $k^{th}$ bit in the first expected value, the monitoring apparatus outputs, according to a result of the comparing the value of the $k^{th}$ bit in the second MPI address information with the value of the $k^{th}$ bit in the first expected value, the $k^{th}$ filtering result corresponding to the $k^{th}$ bit in the second MPI address information.

In particular, if the monitoring apparatus compares the value of the $k^{th}$ bit in the second MPI address information with that in the first expected value, it indicates that the value of the $k^{th}$ bit in the first comparison value is different from the first preset value. In this case, the monitoring apparatus determines whether the value of the $k^{th}$ bit in the second MPI address information is the same as the $k^{th}$ bit in each first MPI information separately, and outputs a filtering result; in this case, a filtering result of the $k^{th}$ bit filtering circuit in the address filter of the monitoring apparatus is determined according to the value of the $k^{th}$ bit in the second MPI address information.

It should be noted that, when the $k^{th}$ bit filtering circuit in the address filter of the monitoring apparatus includes an XOR gate and an AND gate, the first preset value is 0; if the value of the $k^{th}$ bit in the second MPI address information is the same as the value of the $k^{th}$ bit in the first expected value, the $k^{th}$ filtering result output by the monitoring apparatus is 0; or, if the value of the $k^{th}$ bit in the second MPI address information is different from the value of the $k^{th}$ bit in the first expected value, the $k^{th}$ filtering result output by the monitoring apparatus is 1. When the $k^{th}$ bit filtering circuit in the address filter of the monitoring apparatus includes an XNOR gate and an OR gate, the first preset value is 1; if the value of the $k^{th}$ bit in the second MPI address information is the same as the value of the $k^{th}$ bit in the first expected value, the $k^{th}$ filtering result output by the monitoring apparatus is 1; or, if the value of the $k^{th}$ bit in the second MPI address information is different from the value of the $k^{th}$ bit in the first expected value, the $k^{th}$ filtering result output by the monitoring apparatus is 0.

Exemplarily, when n=2, $2^n$=4, and the configuration information corresponding to the first service is MPI information 1 and MPI information 2, where MPI information 1 and MPI information 2 are two pieces of first MPI information. Assuming that address information of MPI information 1 is 0001, and address information of MPI information 2 is 0000, the first comparison value is 1110, and the first expected value is 0001; if the second MPI address information is 0010, and the first preset value is 0, when k=1, the monitoring apparatus compares the value 1 of the $1^{st}$ bit in the second MPI address information with the value 0 of the $1^{st}$ bit in the first expected value; and because 1 is different from 0, the $1^{st}$ filtering result output by the monitoring apparatus is 1.

S403: If skipping comparing the value of the $k^{th}$ bit in the second MPI address information with the value of the $k^{th}$ bit in the first expected value, the monitoring apparatus outputs the $k^{th}$ filtering result according to the value of the $k^{th}$ bit in the first comparison value.

After the monitoring apparatus determines, according to the value of the $k^{th}$ bit in the first comparison value, whether to compare the value of the $k^{th}$ bit in the second MPI address information with the value of the $k^{th}$ bit in the first expected value, if skipping comparing the value of the $k^{th}$ bit in the second MPI address information with the value of the $k^{th}$ bit in the first expected value, the monitoring apparatus outputs the $k^{th}$ filtering result according to the value of the $k^{th}$ bit in the first comparison value.

In particular, if the monitoring apparatus skips comparing the value of the $k^{th}$ bit in the second MPI address information with that in the first expected value, it indicates that the value of the $k^{th}$ bit in the first comparison value is the same as the first preset value, that is, the value of the $k^{th}$ bit in the second MPI address information may be 0 or 1, and the value of the $k^{th}$ bit in the second MPI address information may only be 0 or 1; therefore, the monitoring apparatus may output the $k^{th}$ filtering result according to the value of the $k^{th}$ bit in the first comparison value, where the $k^{th}$ filtering result indicates that the value of the $k^{th}$ bit in the second MPI address information is the same as a value of the $k^{th}$ bit in the first MPI information.

It should be noted that, when the $k^{th}$ bit filtering circuit in the address filter of the monitoring apparatus includes an XOR gate and an AND gate, the first preset value is 0, and when the first comparison value is 0, the value of the $k^{th}$ bit in the second MPI address information and the value of the $k^{th}$ bit in the first expected value are not compared, the $k^{th}$ filtering result output by the monitoring apparatus is 0; and when the $k^{th}$ bit filtering circuit in the address filter of the monitoring apparatus includes an XNOR gate and an OR gate, the first preset value is 1, and when the first comparison value is 1, the value of the $1^{st}$ bit in the second MPI address information and the value of the $1^{st}$ bit in the first expected value are not compared, the $1^{st}$ filtering result output by the monitoring apparatus is 1.

Exemplarily, when n=2, $2^n$=4, and the configuration information corresponding to the first service is MPI information 1 and MPI information 2, where MPI information 1 and MPI information 2 are two pieces of first MPI information. Assuming that address information of MPI information 1 is 0001, and address information of MPI information 2 is 0000, the first comparison value is 1110, and the first expected value is 0001; if the second MPI address information is 0010, and the first preset value is 0, when k=0, a value of the $0^{th}$ bit in the first comparison value is 0, and the monitoring apparatus may output the $0^{th}$ filtering result according to the first comparison value; therefore, the $0^{th}$ filtering result output by the monitoring apparatus is 0.

It should be noted that, in the embodiment of the present invention, S402 and S403 are two parallel steps after S401; and an execution sequence of S402 and S403 is not limited in the present invention, that is, the monitoring apparatus may first execute S401 and S402, and then execute S403, or may first execute S401 and S403, and then execute S402, which is not limited in the present invention.

Further, S401 to S403 are a method for determining, by the monitoring apparatus, the $k^{th}$ filtering result corresponding to the $k^{th}$ bit in the second MPI address information. It can be deduced, from the method, that the method for separately determining $2^n$ filtering results by the monitoring apparatus is the same as the method for determining the $k^{th}$ filtering result by the monitoring apparatus. In this way, the monitoring apparatus determines $2^n$ filtering results.

S302: The monitoring apparatus determines, according to the $2^n$ filtering results, whether the second MPI information is the first MPI information.

After the monitoring apparatus separately determines, according to the value of each bit in the $2^n$ bits in the second MPI address information, the value of each bit in the $2^n$ bits in the first comparison value, and the value of each bit in the $2^n$ bits in the first expected value, the $2^n$ filtering results corresponding to the $2^n$ bits in the second MPI address information, the monitoring apparatus determines, according to the $n$ filtering results, whether the second MPI information is the first MPI information.

It can be understood that the $2^n$ bit filtering circuits in the address filter of the monitoring apparatus output the $2^n$ filtering results, and the $k^{th}$ filtering result output by the $k^{th}$ bit filtering circuit indicates whether the value of the $k^{th}$ bit in the second address information is the same as the value of the $k^{th}$ bit in the first MPI information; therefore, the monitoring apparatus may compare, according to the $2^n$ filtering results, whether a value of each bit in the second MPI information is the same as a value of a corresponding bit in the first MPI address information, so as to determine whether the second MPI information is the first MPI information.

It should be noted that a process of filtering the first MPI information by the monitoring apparatus is implemented by an address filter in the monitoring apparatus.

Specifically, when the $k^{th}$ bit filtering circuit in the address filter of the monitoring apparatus includes an XOR gate and an AND gate, the first preset value is 0, and if the $2^n$ filtering results output by the monitoring apparatus are all 0s, the second MPI information is the first MPI information; or, if any one filtering result of the $2^n$ filtering results output by the monitoring apparatus is not 0, the second MPI information is not the first MPI information. When the $k^{th}$ bit filtering circuit in the address filter of the monitoring apparatus includes an XNOR gate and an OR gate, the first preset value is 1, and if the $2^n$ filtering results output by the monitoring apparatus are all 1s, the second MPI information is the first MPI information; or, if any one filtering result of the $2^n$ filtering results output by the monitoring apparatus is not 1, the second MPI information is not the first MPI information.

Figure 19:
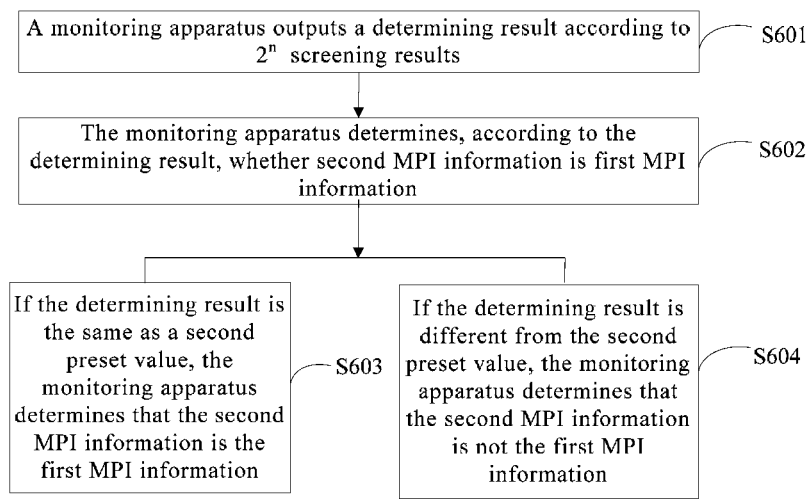
FIG. 19 is a sixth flowchart of a monitoring method according to an embodiment of the present invention.

Specifically, as shown in FIG. 19, that the monitoring apparatus determines, according to the $2^n$ filtering results, whether the second MPI information is the first MPI information includes the following S601 to S604.

S601: The monitoring apparatus outputs a determining result according to the $2^n$ filtering results.

The monitoring apparatus outputs the determining result according to the $2^n$ filtering results.

It should be noted that a process of outputting the determining result according to the $2^n$ filtering results by the monitoring apparatus is implemented in an n-level first logic gate circuit in the address filter of the monitoring apparatus. In the embodiment of the present invention, the first logic gate may be an OR gate or an AND gate.

Further, when the $k^{th}$ bit filtering circuit in the address filter of the monitoring apparatus includes an XOR gate and an AND gate, the n-level first logic gate circuit is an n-level OR gate circuit; and when the $k^{th}$ bit filtering circuit in the address filter of the monitoring apparatus includes an XNOR gate and an OR gate, the n-level first logic gate circuit is an n-level AND gate circuit.

It should be noted that, when the $k^{th}$ bit filtering circuit in the address filter of the monitoring apparatus includes an XOR gate and an AND gate, and the n-level first logic gate circuit is an n-level OR gate circuit, if the $2^n$ filtering results output by the monitoring apparatus are all 0s, the determining result output by the monitoring apparatus is 0; or, if any one filtering result of the $2^n$ filtering results output by the monitoring apparatus is not 0, the determining result output by the monitoring apparatus is 1. When the $k^{th}$ bit filtering circuit in the address filter of the monitoring apparatus includes an XNOR gate and an OR gate, and the n-level first logic gate circuit is an n-level AND gate circuit, if the $2^n$ filtering results output by the monitoring apparatus are all 1s, the determining result output by the monitoring apparatus is 1; or, if any one filtering result of the $2^n$ filtering results output by the monitoring apparatus is not 1, the determining result output by the monitoring apparatus is 0.

Exemplarily, when $n=2$, $2^n=4$, and the configuration information corresponding to the first service is MPI information 1 and MPI information 2, where MPI information 1 and MPI information 2 are two pieces of first MPI information. Assuming that address information of MPI information 1 is 0001, and address information of MPI information 2 is 0000, the first comparison value is 1110, and the first expected value is 0001. If the second MPI address information is 0000, and the first preset value is 0, the $0^{th}$ filtering result output by the monitoring apparatus is 0, the $1^{st}$ filtering result output by the monitoring apparatus is 0, the $2^{nd}$ filtering result output by the monitoring apparatus is 0, and the $3^{rd}$ filtering result output by the monitoring apparatus is 0, and therefore, the determining result output by the monitoring apparatus is 0; or, if the second MPI address information is 0010, and the first preset value is 0, the $0^{th}$ filtering result output by the monitoring apparatus is 0, the $1^{st}$ filtering result output by the monitoring apparatus is 1, the $2^{nd}$ filtering result output by the monitoring apparatus is 0, and the $3^{rd}$ filtering result output by the monitoring apparatus is 0, and therefore, the determining result output by the monitoring apparatus is 1.

S602: The monitoring apparatus determines, according to the determining result, whether the second MPI information is the first MPI information.

After the monitoring apparatus outputs the determining result according to the $2^n$ filtering results, the monitoring apparatus determines, according to the determining result, whether the second MPI information is the first MPI information.

Specifically, the monitoring apparatus may compare the determining result with a second preset value, so as to determine whether the second MPI information is the first MPI information.

It should be noted that, when the $k^{th}$ bit filtering circuit in the address filter of the monitoring apparatus includes an XOR gate and an AND gate, and the n-level first logic gate circuit is an n-level OR gate circuit, the second preset value is 0; and when the $k^{th}$ bit filtering circuit in the address filter of the monitoring apparatus includes an XNOR gate and an OR gate, and the n-level first logic gate circuit is an n-level AND gate circuit, the second preset value is 1. A specific setting of the second preset value is related to a circuit that implements the monitoring apparatus, which is not limited in the present invention.

S603: If the determining result is the same as a second preset value, the monitoring apparatus determines that the second MPI information is the first MPI information.

After the monitoring apparatus determines, according to the determining result, whether the second MPI information is the first MPI information, if the determining result is the same as the second preset value, the monitoring apparatus determines that the second MPI information is the first MPI information.

Exemplarily, when n=2, $2^n$=4, and the configuration information corresponding to the first service is MPI information 1 and MPI information 2, where MPI information 1 and MPI information 2 are two pieces of first MPI information. Assuming that address information of MPI information 1 is 0001, and address information of MPI information 2 is 0000, the first comparison value is 1110, and the first expected value is 0001. If the second MPI address information is 0000, the first preset value is 0, and the second preset value is 0, the determining result output by the monitoring apparatus is 0; and because the determining result output by the monitoring apparatus is 0, which is the same as the second preset value 0, the monitoring apparatus may determine that the second MPI information is the first MPI information.

S604: If the determining result is different from the second preset value, the monitoring apparatus determines that the second MPI information is not the first MPI information.

After the monitoring apparatus determines, according to the determining result, whether the second MPI information is the first MPI information, if the determining result is different from the second preset value, the monitoring apparatus determines that the second MPI information is not the first MPI information.

Exemplarily, when n=2, $2^n$=4, and the configuration information corresponding to the first service is MPI information 1 and MPI information 2, where MPI information 1 and MPI information 2 are two pieces of first MPI information. Assuming that address information of MPI information 1 is 0001, and address information of MPI information 2 is 0000, the first comparison value is 1110, and the first expected value is 0001. If the second MPI address information is 0010, the first preset value is 0, and the second preset value is 0, the determining result output by the monitoring apparatus is 1; and because the determining result output by the monitoring apparatus is 1, which is different from the second preset value 0, the monitoring apparatus may determine that the second MPI information is not the first MPI information.

It should be noted that, in the embodiment of the present invention, S603 and S604 are two parallel steps after S602; and an execution sequence of S603 and S604 is not limited in the present invention, that is, the monitoring apparatus may first execute S602 and S603, and then execute S604, or may first execute S602 and S604, and then execute S603, which is not limited in the present invention.

S203: If the second MPI information is the first MPI information, the monitoring apparatus saves the second MPI information, which may be checked at the time of locating an error point in the first MPI information delivered by a system chip.

After the monitoring apparatus determines, according to the second MPI address information, the first comparison value, and the first expected value, whether the second MPI information is first MPI information, if the second MPI information is the first MPI information, the monitoring apparatus saves the second MPI information, which may be checked at the time of locating an error point in the first MPI information delivered by the system chip.

Specifically, if the second MPI information is the first MPI information, the monitoring apparatus writes, by using its internal read/write controller, the second MPI information into the memory inside the monitoring apparatus, so as to save the second MPI information, which may be checked at the time of locating an error point in the first MPI information delivered by the system chip.

It can be understood that, when the monitoring apparatus determines that the second MPI information is the first MPI information, the monitoring apparatus records the second MPI information. In this way, if an error occurs when the service chip processes the first service, a test person may check the second MPI information, namely, the first MPI information corresponding to the first service, stored in the monitoring apparatus to accurately determine whether an error occurs when the system chip delivers the first MPI information, so as to locate an error point in the first MPI information delivered by the system chip.

It should be noted that the second MPI information is any one of the multiple pieces of MPI information that are acquired by the monitoring apparatus; when storing multiple pieces of second MPI information, the monitoring apparatus saves the multiple pieces of second MPI information according to a time sequence of receiving the multiple pieces of second MPI information.

In particular, when an error occurs in the first service, a test person may not only check whether content of one piece of second MPI information delivered by the system chip is correct, but also check whether a time sequence of the multiple pieces of second MPI information delivered by the system chip is correct, thereby improving efficiency of accurately locating an error point that occurs when the system chip delivers the first MPI information.

Exemplarily, assuming that the first MPI information that is corresponding to the first service and is delivered by the system chip is MPI information 1 and MPI information 2, and the second MPI information that is obtained by the monitoring apparatus by filtering is MPI information 3 and MPI information 4. Address information of MPI information 1 is 0000, and data information of MPI information 1 is A; address information of MPI information 2 is 0001, and data information of MPI information 2 is B; address information of MPI information 3 is 0000, and data information of MPI information 3 is B; and address information of MPI information 4 is 0001, and data information of MPI information 4 is A. A test person may obtain the MPI information that is corresponding to the first service and is in the monitoring apparatus, that is, MPI information 3 and MPI information 4, and historical information of MPI information 1 and MPI information 2 that are corresponding to the first service and are delivered by a system, so as to find out that a time sequence of delivering MPI information 1 and MPI information 2 by the system chip is wrong, so that the service chip processes the first service incorrectly or abnormally.

S204: If the second MPI information is not the first MPI information, the monitoring apparatus does not save the second MPI information, so as to filter out the second MPI information.

After the monitoring apparatus determines, according to the second MPI information, the first comparison value, and the first expected value, whether the second MPI information is the first MPI information, if the second MPI information is not the first MPI information, the monitoring apparatus does not save the second MPI information, so as to filter out the second MPI information.

It can be understood that, when the monitoring apparatus determines that the second MPI information is not the first MPI information, because the second MPI information is not configuration information corresponding to the first service, the monitoring apparatus does not need to record the second MPI information when monitoring the configuration information of the first service, that is, if an error occurs when the service chip processes the first service, a test person does not need to check the second MPI information; therefore, the monitoring apparatus does not store the second MPI information.

It should be noted that, in the embodiment of the present invention, S203 and S204 are two parallel steps after S202; and an execution sequence of S203 and S204 is not limited in the present invention, that is, the monitoring apparatus may first execute S202 and S203, and then execute S204, or may first execute S202 and S204, and then execute S203, which is not limited in the present invention.

In particular, the monitoring method provided in the embodiment of the present invention may be used when joint debugging is performed on software and hardware of any two chips, and a specific application scenario is not limited by the embodiment of the present invention.

According to the monitoring method provided in the embodiment of the present invention, a monitoring apparatus acquires second MPI information, a first comparison value, and a first expected value, where the first comparison value and the first expected value are separately corresponding to a first service that is preset; the monitoring apparatus determines, according to the second MPI information, the first comparison value, and the first expected value, whether the second MPI information is first MPI information, where the first MPI information is corresponding to the first service; and if the second MPI information is the first MPI information, the monitoring apparatus saves the second MPI information, which may be checked at the time of locating an error point in the first MPI information delivered by a system chip. According to this solution, when the system chip delivers MPI information, an address filter obtains, by filtering, the first MPI information corresponding to the first service, and the first MPI information is stored in a memory according to a time sequence of receiving the MPI information; therefore, when an error occurs in the first service of a service chip, by using first service information stored in the monitoring apparatus, an error point in the MPI information delivered by the system chip can be accurately located, thereby improving efficiency of locating an error point in configuration of the service chip.

Embodiment 4

Figure 20:
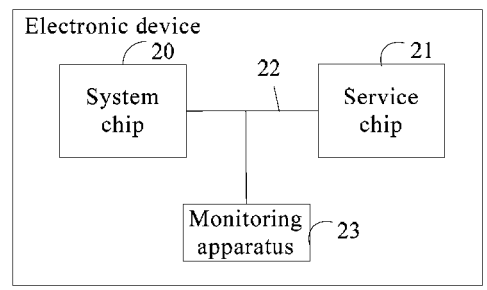
FIG. 20 is a schematic structural diagram of an electronic device according to an embodiment of the present invention.

As shown in FIG. 20, the embodiment of the present invention provides an electronic device, where the electronic device may include: a system chip 20, a service chip 21, and a system bus 22, and the electronic device may further include: a monitoring apparatus 23.

The monitoring apparatus 23, the system chip 20, and the service chip 21 are connected by using the system bus 22.

The system chip 20 is configured to deliver the multiple pieces of MPI information to the service chip 21 by using the system bus 22.

The service chip 21 is configured to implement, based on each piece of MPI information in the multiple pieces of MPI information, a service corresponding to the MPI information.

The monitoring apparatus 23 is configured to store the first MPI information that is used to monitor a first service.

Optionally, the system chip 20 is connected to a first MPI interface of the service chip 21 by using a second MPI interface.

It should be noted that the monitoring apparatus 23 may include: an address filter, a read/write controller connected to the address filter, and a memory connected to the read/write controller.

The address filter is configured to acquire the multiple pieces of MPI information, and obtain, by filtering the multiple pieces of MPI information, the first MPI information corresponding to the first service that is preset.

The read/write controller is configured to write, into the memory according to a time sequence of receiving the first MPI information, the first MPI information that is obtained by the address filter by filtering.

The memory is configured to store the first MPI information written by the read/write controller.

Optionally, the write module includes a summator and a first register configured to successively store, under a function of the summator, two pieces of first MPI information that are to be written into the memory and corresponding to the first service; and the read module includes a second register, configured to store the first MPI information that is from the address filter.

Optionally, the memory is specifically configured to store parity check data information, multiple pieces of MPI address information, and multiple pieces of MPI data information.

The system chip 20 may be an SOC chip, where the SOC chip includes a CPU core that supports an RISC instruction structure inside, for example, a common ARM core. The SOC chip supports service software running inside. The service chip 21 is an ASIC that supports service processing, for example, an ASIC that supports ONT service processing, and the service chip 21 does not include a CPU core inside. A software configuration interface between the SOC chip and the service chip 21 is an MPI interface; currently, a commonly-used MPI interface includes a PCIe bus interface, an AMBA bus interface, and the like.

Figure 21:
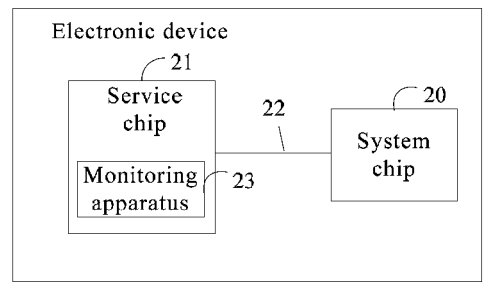
FIG. 21 is a first schematic structural diagram of an electronic device according to an embodiment of the present invention.

As shown in FIG. 21, the embodiment of the present invention further provides an electronic device, including a system chip 20, a service chip 21, and a system bus 22, where the service chip 21 further includes a monitoring apparatus 23, that is, the monitoring apparatus 23 is disposed in the service chip 21. The system chip 20 and the service chip 21 are connected by using the system bus 22. The service chip 21 includes at least one service module 210 and a first MPI interface 211. The system chip 20 is configured to deliver the multiple pieces of MPI information to the service chip 21 by using the system bus 22. The service chip 21 is configured to implement, based on each piece of MPI information in the multiple pieces of MPI information, a service corresponding to the MPI information.

Figure 22:
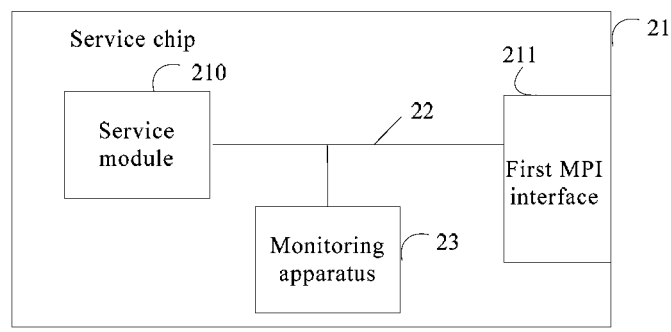
FIG. 22 is a second schematic structural diagram of an electronic device further according to an embodiment of the present invention.

As shown in FIG. 22, the monitoring apparatus 23 is connected to the first MPI interface 211 and the at least one service module 210 by using the system bus 22, and is configured to store the first MPI information that is used to monitor a first service.

It should be noted that one service module 210 in the service chip 21 may implement one service function; and in an actual application, implementation of one service may be implemented jointly by multiple service modules 210.

Optionally, a first input pin of a second logic gate in the $k^{th}$ bit filtering circuit in $2^n$ bit filtering circuits of the monitoring apparatus 23, a second input pin of the second logic gate, and a second input pin of a third logic gate in the $k^{th}$ bit filtering circuit are separately connected to the first MPI interface 211 by using the system bus 22, where $n \geq 1$, and $0 \leq k \leq 2^n - 1$.

Figure 23:
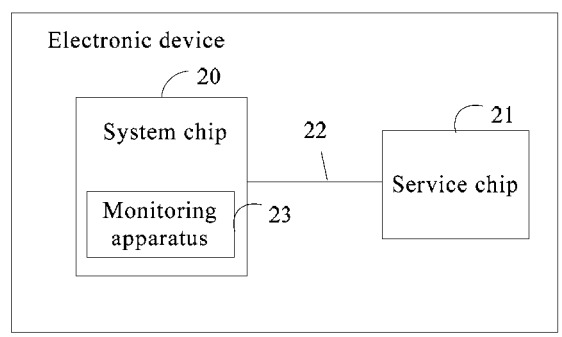
FIG. 23 is a first schematic structural diagram of another electronic device further according to an embodiment of the present invention.
Figure 24:
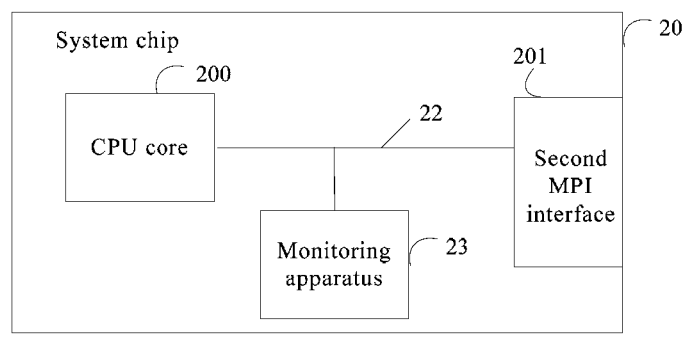
FIG. 24 is a second schematic structural diagram of another electronic device further according to an embodiment of the present invention.

As shown in FIG. 23, the embodiment of the present invention further provides an electronic device, including a system chip 20, a service chip 21, and a system bus 22, where the system chip 20 further includes a monitoring apparatus 23, that is, the monitoring apparatus 23 is disposed in the system chip 20. The system chip 20 and the service chip 21 are connected by using the system bus 22. As shown in FIG. 24, the system chip 20 includes a central processing unit CPU core 200 and a second MPI interface 201. The system chip 20 is configured to deliver the multiple pieces of MPI information to the service chip 21 by using the system bus 22. The service chip 21 is configured to implement, based on each piece of MPI information in the multiple pieces of MPI information, a service corresponding to the MPI information.

The monitoring apparatus 23 is connected to the second MPI interface 201 and the CPU core 200 by using the system bus 22, and is configured to store the first MPI information that is used to monitor a first service.

Optionally, a first input pin of a second logic gate in the $k^{th}$ bit filtering circuit in $2^n$ bit filtering circuits of the monitoring apparatus 23, a second input pin of the second logic gate, and a second input pin of a third logic gate in the $k^{th}$ bit filtering circuit are separately connected to the second MPI interface 201 by using the system bus 22.

It should be noted that the monitoring apparatus 23 further includes an n-level first logic gate circuit, where the n-level first logic gate circuit is connected to the $2^n$ bit filtering circuits.

It can be understood that, an AND gate and an OR gate are inverse logic gates of each other, and an XNOR gate and an XOR gate are inverse logic gates of each other; therefore, in the embodiment of the present invention, the $k^{th}$ bit filtering circuit may be implemented by various types of circuits:

(1) When the first logic gate is an OR gate, the second logic gate is an XOR gate, the third logic gate is an AND gate, and the $k^{th}$ bit filtering circuit includes the XOR gate and the AND gate.

(2) When the first logic gate is an AND gate, the second logic gate is an XNOR gate, the third logic gate is an OR gate, and the $k^{th}$ bit filtering circuit includes the AND gate and the XNOR gate.

Further, in the embodiment of the present invention, the $k^{th}$ bit filtering circuit may further be formed by a logic component that may implement a function of the $k^{th}$ bit filtering circuit, which is not limited in the present invention.

It should be noted that the electronic device provided in the embodiment of the present invention may be an electronic device with a CPU, for example, a mobile phone, a computer, or a tablet computer.

The embodiment of the present invention provides an electronic device, where the electronic device includes a system chip, a service chip, and a system bus, and the electronic device may further include: a monitoring apparatus. The monitoring apparatus includes an address filter, a read/write controller connected to the address filter, and a memory connected to the read/write controller, where the address filter is configured to acquire multiple pieces of MPI information, and obtain, by filtering the multiple pieces of MPI information, first MPI information corresponding to a first service that is preset; the read/write controller is configured to write, into the memory according to a time sequence of receiving the first MPI information, the first MPI information that is obtained by the address filter by filtering; and the memory is configured to store the first MPI information written by the read/write controller. According to this solution, when the system chip delivers MPI information, the address filter obtains, by filtering, the first MPI information corresponding to the first service, and the first MPI information is stored in the memory according to a time sequence of receiving the MPI information; therefore, when an error occurs in the first service of the service chip, by using first service information stored in the monitoring apparatus, an error point in the MPI information delivered by the system chip can be accurately located, thereby improving efficiency of locating an error point in configuration of the service chip.

It may be clearly understood by a person skilled in the art that, for the purpose of convenient and brief description, division of the foregoing function modules is taken as an example for illustration. In actual application, the foregoing functions can be allocated to different function modules and implemented according to a requirement, that is, an inner structure of an apparatus is divided into different function modules to implement all or part of the functions described above. For a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners For example, the described apparatus embodiment is merely exemplary. For example, the module or unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present invention essentially, or the part contributing to the prior art, or all or a part of the technical solutions may be implemented in the form of a software product. The software product is stored in a storage medium and includes several instructions for instructing a computer device (which may be a personal computer, a server, or a network device) or a processor to perform all or a part of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A monitoring apparatus incorporated within a service chip that receives a second microprocessor interface (MPI) information from a system chip, the monitoring apparatus comprising:
an address filter for the second MPI information;
a read/write controller connected to the address filter; and
a memory connected to the read/write controller;
wherein the address filter is configured to acquire:
multiple pieces of the second MPI information, and
a first comparison value and a first expected value that separately correspond to a first service that is preset on the service chip;
wherein the address filter is further configured to obtain a first MPI information which corresponds to the first service that is preset by filtering the multiple pieces of the second MPI information according to: the second MPI information, the first comparison value, and the first expected value;
wherein the read/write controller is configured to receive the first MPI information,
wherein the read/write controller is further configured to write the first MPI information into the memory according to a time sequence of receiving the first MPI information, and
wherein the memory is configured to store the first MPI information written by the read/write controller.

2. The monitoring apparatus according to claim 1, wherein each piece of the multiple pieces of the second MPI information comprises one piece of a second MPI address information,
wherein the one piece of the second MPI address information comprises $2^n$ bits, where $n>1$;
wherein the address filter comprises $2^n$ bit filtering circuits and an n-level first logic gate circuit that comprises $2^n-1$ first logic gates,
wherein an $m^{th}$-level first logic gate circuit in the n-level first logic gate circuit comprises $2^{n-m}$ first logic gates,
wherein all the $2^n-1$ first logic gates are, as a group, either an OR gate or an AND gate,
wherein $1 \leq m \leq n$,
wherein the $2^n$ bit filtering circuits of the address filter are configured to separately acquire values of $2^n$ bits of the second MPI address information, perform filtering on the values of the $2^n$ bits of the second MPI address information for a particular piece of the multiple pieces of the second MPI information and output $2^n$ filtering results; and
wherein the n-level first logic gate circuit of the address filter is configured to determine, according to the $2^n$ filtering results, whether the particular piece of the multiple pieces of the second MPI information is the first MPI information.

3. The monitoring apparatus according to claim 2,
wherein a $k^{th}$ bit filtering circuit in the $2^n$ bit filtering circuits comprises:
one second logic gate and one third logic gate wherein the second logic gate comprises a first input pin, a second input pin, and an output pin of the second logic gate, and the third logic gate comprises a first input pin, a second input pin, and an output pin of the third logic gate,
wherein the output pin of the second logic gate is connected to the first input pin of the third logic gate, the second logic gate is an XOR gate or an XNOR gate, and the third logic gate is an AND gate or an OR gate;
wherein when the first logic gate is an OR gate, the second logic gate is an XOR gate, and the third logic gate is an AND gate; and, when the first logic gate is an AND gate, the second logic gate is an XNOR gate, and the third logic gate is an OR gate;
wherein the first input pin of the second logic gate is configured to acquire the second MPI information using a system bus,
wherein the second input pin of the second logic gate is configured to acquire a first expected value using the system bus,
wherein the output pin of the second logic gate is configured to output a first operation result obtained after an operation is performed by the second logic gate on the second MPI information and the first expected value,
wherein the second input pin of the third logic gate is configured to acquire a first comparison value using the system bus,
wherein the output pin of the third logic gate is configured to output a second operation result obtained after an operation is performed by the third logic gate on the first comparison value and the first operation result, and
wherein the second operation result is the filtering result, and where $0<k<2^n-1$.

4. The monitoring apparatus according to claim 3,
wherein a $j^{th}$ first logic gate in the $m^{th}$-level first logic gate circuit comprises: a first input pin, a second input pin, and an output pin of the $j^{th}$ first logic gate in the $m^{th}$-level first logic gate circuit, where $1 \leq j \leq 2^{n-m}$;
wherein when m =1, the first input pin of the $j^{th}$ first logic gate in the first-level first logic gate circuit is connected to the output pin of the third logic gate in the $k^{th}$ bit filtering circuit, and the second input pin of the $j^{th}$ first logic gate in the first-level first logic gate circuit is connected to an output pin of the third logic gate in the $(k+1)^{th}$ bit filtering circuit, where k is an even number,
wherein the first input pin of the $j^{th}$ first logic gate in the first-level first logic gate circuit is configured to acquire the filtering result that is output by the $k^{th}$ bit filtering circuit, the second input pin of the $j^{th}$ first logic gate in the first-level first logic gate circuit is configured to acquire a filtering result that is output by the $(k+1)^{th}$ bit filtering circuit, and the output pin of the $j^{th}$ first logic gate in the first-level first logic gate circuit is configured to output a result obtained after an operation is performed by the $j^{th}$ first logic gate on the filtering result that is output by the $k^{th}$ bit filtering circuit and the filtering result that is output by the $(k+1)^{th}$ bit filtering circuit;
wherein when $1<m \leq n-1$, the output pin of the $j^{th}$ first logic gate in the $m^{th}$-level first logic gate circuit is connected to a first input pin of the $(j+1)/2^{th}$ first logic gate in the $(m+1)^{th}$-level first logic gate circuit, and an output pin of the $(j+1)^{th}$ first logic gate in the $m^{th}$-level first logic gate circuit is connected to a second input pin of the $(j+1)/2^{th}$ first logic gate in the $(m+1)^{th}$-level first logic gate circuit, where j is an odd number,
wherein the first input pin of the $(j+1)/2^{th}$ first logic gate in the $(m+1)^{th}$-level first logic gate circuit is configured to acquire a result that is output by the $j^{th}$ first logic gate in the $m^{th}$-level first logic gate circuit, the second input pin of the $(j+1)/2^{th}$ first logic gate in the $(m+1)^{th}$-level first logic gate circuit is configured to acquire a result that is output by the $(j+1)^{th}$ first logic gate in the $m^{th}$-level first logic gate circuit, and an output pin of the $(j+1)/2^{th}$ first logic gate in the $(m+1)^{th}$-level first logic gate circuit is configured to output a result obtained after an operation is performed by the $(j+1)/2^{th}$ first logic gate in the $(m+1)^{th}$-level first logic gate circuit on the result that is output by the $j^{th}$ first logic gate in the $m^{th}$-level first logic gate circuit and the result that is output by the $(j+1)^{th}$ first logic gate in the $m^{th}$-level first logic gate circuit;

wherein when $m = n-1$, the output pin of the $(j+1)/2^{th}$ first logic gate in the $(m+1)^{th}$-level first logic gate circuit is connected to the read/write controller, and wherein the result obtained after an operation is performed by the $(j+1)/2^{th}$ first logic gate in the $(m+1)^{th}$-level first logic gate circuit on the result that is output by the $j^{th}$ first logic gate in the $m^{th}$-level first logic gate circuit and the result that is output by the $(j+1)^{th}$ first logic gate in the $m^{th}$-level first logic gate circuit is a determining result, and the determining result is used to indicate whether the second MPI information is the first MPI information.

5. The monitoring apparatus according to claim 1, wherein the read/write controller comprises: a write module and a read module, wherein the write module comprises a summator and a first register configured to successively store, under a function of the summator, two pieces of first MPI information that are to be written into the memory and corresponding to the first service; and wherein the read module comprises a second register, configured to store the first MPI information that is from the address filter.

6. The monitoring apparatus of claim 1, wherein each piece of the multiple pieces of the second MPI information comprises:
   a second MPI address information, and
   a second MPI data information that corresponds to the second MPI address information; and wherein obtaining the first MPI information by the filtering the multiple pieces of the second MPI information comprises comparing, according to a bit processing mask specified by the first comparison value, a first set of address bits of the second MPI address information and a second set of address bits of the first expected value.

7. The monitoring apparatus according to claim 6, wherein the memory is configured to store:
   a parity check data information, and
   the first MPI information including, for ones of the multiple pieces of the second MPI information, the second MPI address information and the second MPI data information obtained from filtering the multiple pieces of the second MPI information.

8. A monitoring method, carried out by a monitoring apparatus incorporated within a service chip that receives a second microprocessor interface (MPI) information from a system chip, the monitoring method comprising:
   acquiring, by the monitoring apparatus:
      the second MPI information, and
      a first comparison value and a first expected value that separately correspond to a first service that is preset on the service chip;
   determining, by the monitoring apparatus, that the second MPI information is a first MPI information corresponding to the first service according to: the second MPI information, the first comparison value, and the first expected value; and
   saving, by the monitoring apparatus, the first MPI information in a memory, for locating an error point in the first MPI information that is provided by the system chip to the service chip.

9. The monitoring method according to claim 8, wherein the second MPI information comprises second MPI address information and second MPI data information that corresponds to the second MPI address information, and
   wherein the determining comprises:
      determining the second MPI information is the first MPI information corresponding to the first service according to: the second MPI address information of the second MPI information, the first comparison value, and the first expected value.

10. The monitoring method according to claim 9, wherein determining comprises:
    separately determining, according to a value of each bit in $2^n$ bits in the second MPI address information, a value of each bit in $2^n$ bits in the first comparison value, and a value of each bit in $2^n$ bits in the first expected value, $2^n$ filtering results corresponding to the $2^n$ bits in the second MPI address information, wherein $n>1$; and
    determining the second MPI information is the first MPI information corresponding to the first service according to the $2^n$ filtering results.

11. The monitoring method according to claim 10, wherein separately determining the $2^n$ filtering results corresponding to the $2^n$ bits in the second MPI address information comprises:
    determining, according to a value of a $k^{th}$ bit in the first comparison value, whether to compare a value of the $k^{th}$ bit in the second MPI address information with a value of the $k^{th}$ bit in the first expected value, wherein $0 \leq k \leq 2^n - 1$; and
    when comparing the value of the $k^{th}$ bit in the second MPI address information with the value of the $k^{th}$ bit in the first expected value, outputting, according to a result of the comparing the value of the $k^{th}$ bit in the second MPI address information with the value of the $k^{th}$ bit in the first expected value, the $k^{th}$ filtering result corresponding to the $k^{th}$ bit in the second MPI address information.

12. The monitoring method according to claim 11, wherein determining, according to the value of the $k^{th}$ bit in the first comparison value, whether to compare the value of the $k^{th}$ bit in the second MPI address information with the value of the $k^{th}$ bit in the first expected value comprises:
    comparing the value of the $k^{th}$ bit in the first comparison value with a first preset value; and
    when the value of the $k^{th}$ bit in the first comparison value is different from the first preset value, comparing the value of the $k^{th}$ bit in the second MPI address information with the value of the $k^{th}$ bit in the first expected value.

13. The monitoring method according to claim 10, wherein determining the second MPI information is the first MPI information corresponding to the first service according to the $2^n$ filtering results comprises:
    outputting a determining result according to the $2^n$ filtering results;
    determining, according to the determining result, whether the second MPI information is the first MPI information; and determining that the second MPI information is the first MPI information when the determining result is the same as a second preset value.

14. The monitoring method according to claim 8, wherein the method further comprises:
skipping saving the second MPI information, so as to filter out the second MPI information when the second MPI information is not the first MPI information.

15. The monitoring method according to claim 10, wherein separately determining, the $2^n$ filtering results corresponding to the $2^n$ bits in the second MPI address information comprises:
determining, according to a value of a $k^{th}$ bit in the first comparison value, whether to compare a value of the $k^{th}$ bit in the second MPI address information with a value of the $k^{th}$ bit in the first expected value, wherein $0 < k < 2^n - 1$; and
when skipping comparing the value of the $k^{th}$ bit in the second MPI address information with the value of the $k^{th}$ bit in the first expected value, outputting the $k^{th}$ filtering result according to the value of the $k^{th}$ bit in the first comparison value.

16. The monitoring method according to claim 11, wherein determining, according to the value of the $k^{th}$ bit in the first comparison value, whether to compare the value of the $k^{th}$ bit in the second MPI address information with the value of the $k^{th}$ bit in the first expected value comprises:
comparing the value of the $k^{th}$ bit in the first comparison value with a first preset value; and
when the value of the $k^{th}$ bit in the first comparison value is the same as the first preset value, skipping comparing the value of the $k^{th}$ bit in the second MPI address information with the value of the $k^{th}$ bit in the first expected value.

17. The monitoring method according to claim 10, wherein determining, according to the $2^n$ filtering results, whether the second MPI information is the first MPI information comprises:
outputting a determining result according to the $2^n$ filtering results;
determining, according to the determining result, whether the second MPI information is the first MPI information; and
when the determining result is different from the second preset value, determining that the second MPI information is not the first MPI information.

* * * * *